(12) United States Patent
Marion et al.

(10) Patent No.: US 12,494,302 B2
(45) Date of Patent: Dec. 9, 2025

(54) FIBER COMPRISING MICRO DEVICES AND METAL INTERCONNECTS WITH CONTROLLED ELASTICITY

(71) Applicant: Massachusetts Institute of Technology, Cambridge, MA (US)

(72) Inventors: Juliette Marion, Paris (FR); Polina Olegovna Anikeeva, Lexington, MA (US); Yoel Fink, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 278 days.

(21) Appl. No.: 18/332,326

(22) Filed: Jun. 9, 2023

(65) Prior Publication Data
US 2024/0055154 A1    Feb. 15, 2024

Related U.S. Application Data

(60) Provisional application No. 63/371,261, filed on Aug. 12, 2022.

(51) Int. Cl.
*H01B 7/04* (2006.01)
*D03D 1/00* (2006.01)
(Continued)

(52) U.S. Cl.
CPC ............ *H01B 7/04* (2013.01); *D03D 1/0088* (2013.01); *D03D 15/25* (2021.01); *D03D 15/283* (2021.01);
(Continued)

(58) Field of Classification Search
CPC ... H01B 3/44; H01B 7/04; H01B 1/02; H01B 7/06; D03D 15/283; D03D 15/47;
(Continued)

(56) References Cited

U.S. PATENT DOCUMENTS 2,021,004 A * 11/1935 Garrido ................. G01F 11/261
222/455
4,405,686 A * 9/1983 Kuroda ..................... D01F 8/14
428/397
(Continued)

FOREIGN PATENT DOCUMENTS

WO      2021137928 A1    7/2021
WO      2022055610 A1    3/2022

OTHER PUBLICATIONS

Abouraddy, et al. "Towards multimaterial multifunctional fibres that see, hear, sense and communicate." Nature Materials 6.5 (2007): 336-347.
(Continued)

*Primary Examiner* — Timothy J Thompson
*Assistant Examiner* — Michael F McAllister
(74) *Attorney, Agent, or Firm* — Smith Baluch LLP

(57) ABSTRACT

An elastic and conductive fiber includes a cladding with a channel and a conductor disposed therein. The cladding may be made of a thermoplastic elastomer. The conductive fiber includes an excess length of conductor disposed inside of the channel so that the conductive fiber can stretch without applying substantial strain to the conductor and without substantially changing the electrical resistance of the conductive fiber. The conductor inside of the channel may have a buckled shape or a helical shape.

21 Claims, 24 Drawing Sheets

(51) Int. Cl.
  *D03D 15/25* (2021.01)
  *D03D 15/283* (2021.01)
  *D03D 15/292* (2021.01)
  *D03D 15/30* (2021.01)
  *D04B 1/16* (2006.01)
  *H01B 1/02* (2006.01)
  *H01B 3/44* (2006.01)

(52) U.S. Cl.
  CPC ........... *D03D 15/292* (2021.01); *D03D 15/30* (2021.01); *D04B 1/16* (2013.01); *H01B 1/02* (2013.01); *H01B 3/44* (2013.01); *D10B 2321/02* (2013.01); *D10B 2401/061* (2013.01)

(58) Field of Classification Search
  CPC ........ D03D 15/56; D03D 15/30; D03D 15/25; D03D 15/292; D03D 15/67; D03D 1/0088; D04B 1/14; D04B 1/16; D10B 2101/20; D10B 2321/02; D10B 2401/061; D10B 2401/16; D10B 2501/00
  USPC ......................................................... 361/807
  See application file for complete search history.

(56) References Cited

U.S. PATENT DOCUMENTS

| | | | | |
|---|---|---|---|---|
| 7,348,285 | B2* | 3/2008 | Dhawan | D02G 3/441 442/4 |
| 9,365,013 | B2 | 6/2016 | Fink et al. | |
| 10,509,186 | B2* | 12/2019 | Fink | H01B 3/30 |
| 11,269,149 | B2 | 3/2022 | Fink et al. | |
| 11,365,493 | B2* | 6/2022 | Zhou | D01F 1/09 |
| 2008/0157235 | A1* | 7/2008 | Rogers | H05K 1/0283 257/415 |
| 2009/0260848 | A1* | 10/2009 | Perera | H01B 3/426 977/762 |
| 2018/0022856 | A1* | 1/2018 | Fink et al. | |
| 2018/0039036 | A1* | 2/2018 | Fink | F21S 4/15 |
| 2021/0047753 | A1* | 2/2021 | Zhou | D01F 1/09 |
| 2021/0084350 | A1* | 3/2021 | Zhou | |
| 2021/0201121 | A1 | 7/2021 | Fink et al. | |
| 2022/0415538 | A1* | 12/2022 | Zhou | H01B 7/04 |
| 2023/0323572 | A1* | 10/2023 | Katsuta | D02G 3/441 442/301 |

OTHER PUBLICATIONS

Borchani, et al. "Energy method solution for the postbuckling response of an axially loaded bilaterally constrained beam." Mechanics Research Communications 70 (2015): 114-119.
Boussu et al. "Fibrous sensors to help the monitoring of weaving process." Smart Textiles and their applications. Woodhead Publishing, 2016. 375-400.
Canales, et al. "Multifunctional fibers for simultaneous optical, electrical and chemical interrogation of neural circuits in vivo." Nature Biotechnology 33.3 (2015): 277-284, 10 pages.
Chai, "The post-buckling response of a bi-laterally constrained column." Journal of the Mechanics and Physics of Solids 46.7 (1998): 1155-1181.
Chen et al. "Exploring the relationship between applied fabric strain and resultant local yarn strain within the elastic fabric based on finite element method." Journal of Materials Science 55 (2020): 10258-10270.
Elhawary, "Fibre to yarn: staple-yarn spinning." Textiles and Fashion. Woodhead Publishing, 2015. 191-212.
Fu et al. "Fiber supercapacitors utilizing pen ink for flexible/wearable energy storage." Advanced Materials 24.42 (2012): 5713-5718.
Furferi et al. "A novel method for ring spinning performance evaluation based on Computer Aided analysis of yarn geometry." International Journal of Mechanics 6 (2012): 212-221.

He et al. "A highly stretchable fiber-based triboelectric nanogenerator for self-powered wearable electronics." Advanced Functional Materials 27.4 (2017): 1604378 8 pages.
Iqbal, et al. "Yarn Damage Evaluation in the Flat Knitting Process." Autex Research Journal 21.3 (2020): 272-283.
Jang, et al. "Self-assembled three dimensional network designs for soft electronics." Nature Communications 8.1 (2017): 15894, 10 pages.
Jiang, et al. "Theoretical modeling on the deformation behavior of auxetic tubular braid made from modified circular braiding technique." physica status solidi (b) 257.10 (2020): 1900173, 11 pages.
Jiao, et al. "Large deformation solutions to post-buckled beams confined by movable and flexible constraints: A static and dynamic analysis." International Journal of Solids and Structures 128 (2017): 85-98.
Jiao, et al. "Static and dynamic post-buckling analyses of irregularly constrained beams under the small and large deformation assumptions." International Journal of Mechanical Sciences 124 (2017): 203-215.
Kaltenbrunner, et al. "Ultrathin and lightweight organic solar cells with high flexibility." Nature Communications 3.1 (2012): 770, 7 pages.
Kanik, et al. "Strain-programmable fiber-based artificial muscle." Science 365.6449 (2019): 145-150.
Khudiyev, et al. "100 m long thermally drawn supercapacitor fibers with applications to 3D printing and textiles." Advanced Materials 32.49 (2020): 2004971, 9 pages.
Khudiyev, et al. "Thermally drawn rechargeable battery fiber enables pervasive power." Materials Today 52 (2022): 17 pages.
Kim, et al. "Stretchable and foldable silicon integrated circuits." Science 320.5875 (2008): 507-511, 6 pages.
Kitao, et al. "Orientation of polymer molecules during melt spinning. II. Orientation of crystals in as-spun polyolefin fibers." Journal of Polymer Science: Polymer Physics Edition 11.6 (1973): 1091-1109.
Kwietniewski, et al. "Numerical analysis of Helical Auxetic Yarn elastomeric core tension." AIP Conference Proceedings. vol. 2078. No. 1. AIP Publishing, 2019, 8 pages.
Kwon et al. "Cable-type flexible lithium ion battery based on hollow multi-helix electrodes." Advanced Materials 24.38 (2012): 5192-5197.
Lai et al. "Single-thread-based wearable and highly stretchable triboelectric nanogenerators and their applications in cloth-based self-powered human-interactive and biomedical sensing." Advanced Functional Materials 27.1 (2017): 1604462, 10 pages.
Leber, et al. "Compressible and electrically conducting fibers for large-area sensing of pressures." Advanced Functional Materials 30.1 (2020): 1904274, 10 pages.
Lee et al. "Stretchable and suturable fibre sensors for wireless monitoring of connective tissue strain." Nature Electronics 4.4 (2021): 291-301.
Li, et al. "A generic soft encapsulation strategy for stretchable electronics." Advanced Functional Materials 29.8 (2019): 1806630, 12 pages.
Li, et al. "Local wrinkling versus global buckling of stiff film bonded to finite-thick substrate." Extreme Mechanics Letters 29 (2019): 100453, 4 pages.
Liu, Yuan, et al. "Harnessing the interface mechanics of hard films and soft substrates for 3D assembly by controlled buckling." Proceedings of the National Academy of Sciences 116.31 (2019): 15368-15377.
Loke, et al. "Recent progress and perspectives of thermally drawn multimaterial fiber electronics." Advanced Materials 32.1 (2020): 1904911, 30 pages.
Loke, et al. "Structured multimaterial filaments for 3D printing of optoelectronics." Nature Communications 10.1 (2019): 4010, 10 pages.
Lu, et al. "Flexible and stretchable nanowire-coated fibers for optoelectronic probing of spinal cord circuits." Science Advances 3.3 (2017): e1600955, 9 pages.
Ma, et al. "Design and application of 'J-shaped' stress-strain behavior in stretchable electronics: a review." Lab on a Chip 17.10 (2017): 1689-1704.

(56) References Cited

OTHER PUBLICATIONS

Ma, et al. "Design of strain-limiting substrate materials for stretchable and flexible electronics." Advanced Functional Materials 26.29 (2016): 5345-5351, 7 pages.
Ma, et al. "Mechanics of fractal-inspired horseshoe microstructures for applications in stretchable electronics." Journal of Applied Mechanics 83.11 (2016): 111008, 19 pages.
Ma, et al. "Permeable superelastic liquid-metal fibre mat enables biocompatible and monolithic stretchable electronics." Nature Materials 20.6 (2021): 859-868.
Marion et al. "Thermally Drawn Highly Conductive Fibers with Controlled Elasticity." Advanced Materials (2022) 2201081 10 pages.
McAfee et al. "Parametric sensitivity analysis to maximise auxetic effect of polymeric fibre based helical yarn." Composite Structures 162 (2017): 1-12.
Miller, et al. "The manufacture and characterisation of a novel, low modulus, negative Poisson's ratio composite." Composites Science and Technology 69.5 (2009): 651-655.
Nikravesh, et al. "Instabilities of thin films on a compliant substrate: Direct numerical simulations from surface wrinkling to global buckling." Scientific Reports 10.1 (2020): 5728, 19 pages.
Pan et al. "Efficient dye-sensitized photovoltaic wires based on an organic redox electrolyte." Journal of the American Chemical Society 135.29 (2013): 10622-10625.
Pan, et al. "Experimental and theoretical studies of serpentine interconnects on ultrathin elastomers for stretchable electronics." Advanced Functional Materials 27.37 (2017): 1702589, 8 pages.
Peterlin, "Drawing and extrusion of semi-crystalline polymers." Colloid and Polymer Science 265 (1987): 357-382, 26 pages.
Poincloux, et al. "Geometry and elasticity of a knitted fabric." Physical Review X 8.2 (2018): 021075, 14 pages.
Qu, et al. "Superelastic multimaterial electronic and photonic fibers and devices via thermal drawing." Advanced Materials 30.27 (2018): 1707251, 8 pages.
Rein, et al. "Diode fibres for fabric-based optical communications." Nature 560.7717 (2018): 214-218, 17 pages.
Rogers, et al. "Materials and mechanics for stretchable electronics." Science 327.5973 (2010): 1603-1607.
Seung, et al. "Nanopatterned textile-based wearable triboelectric nanogenerator." ACS nano 9.4 (2015): 3501-3509.
Seyedin, et al. "Knitted strain sensor textiles of highly conductive all-polymeric fibers." ACS Applied Materials & Interfaces 7.38 (2015): 21150-21158, 30 pages.
Shim, et al. "Functionalized elastomers for intrinsically soft and biointegrated electronics." Advanced Healthcare Materials 10.17 (2021): 2002105, 33 pages.
Sloan, et al. "The helical auxetic yarn—a novel structure for composites and textiles; geometry, manufacture and mechanical properties." Mechanics of Materials 43.9 (2011): 476-486.
Stoppa et al. "Wearable electronics and smart textiles: A critical review." Sensors 14.7 (2014): 11957-11992.
Sun, et al. "Stretchable conductive fibers of ultrahigh tensile strain and stable conductance enabled by a worm-shaped graphene microlayer." Nano Letters 19.9 (2019): 6592-6599.
Thompson, et al. "From helix to localized writhing in the torsional post-buckling of elastic rods." Proceedings of the Royal Society of London. Series A: Mathematical, Physical and Engineering Sciences 452.1944 (1996): 117-138.
Trung, et al. "Recent progress on stretchable electronic devices with intrinsically stretchable components." Advanced Materials 29.3 (2017): 1603167, 29 pages.
Wang, et al. "Enhanced thermoelectric figure of merit in nanostructured n-type silicon germanium bulk alloy." Applied Physics Letters 93.19 (2008), 3 pages.
Wang, et al. "Natural biopolymer-based biocompatible conductors for stretchable bioelectronics." Chemical Reviews 121.4 (2021): 2109-2146, 38 pages.
Wright, et al. "Tensile properties of helical auxetic structures: A numerical study." Journal of Applied Physics 108.4 (2010), 8 pages.
Xiao, et al. "Buckling morphology of an elastic beam between two parallel lateral constraints: implication for a snake crawling between walls." Journal of The Royal Society Interface 10.85 (2013): 20130399, 6 pages.
Yang et al. "A highly stretchable, fiber-shaped supercapacitor." Angewandte Chemie 125.50 (2013): 13695-13699.
Yin, et al. "Mathematical modeling of yarn dynamics in a generalized twisting system." Scientific Reports 6.1 (2016): 24432, 13 pages.
Yun, et al. "Highly stretchable large area woven, knitted and robust braided textile based interconnection for stretchable electronics." Scientific Reports 11.1 (2021): 4038, 10 pages.
Zeng et al. "Fiber-based wearable electronics: a review of materials, fabrication, devices, and applications." Advanced Materials 26.31 (2014): 5310-5336.
Zhang, et al. "Thermally drawn stretchable electrical and optical fiber sensors for multimodal extreme deformation sensing." Advanced Optical Materials 9.6 (2021): 2001815, 9 pages.
Zhong et al. "Fiber-based generator for wearable electronics and mobile medication." ACS nano 8.6 (2014): 6273-6280.
Zhu, et al. "Ultrastretchable fibers with metallic conductivity using a liquid metal alloy core." Advanced Functional Materials 23.18 (2013): 2308-2314.

\* cited by examiner

FIBER COMPRISING MICRO DEVICES AND METAL INTERCONNECTS WITH CONTROLLED ELASTICITY

CROSS-REFERENCE TO RELATED APPLICATION(S)

This application claims the priority benefit, under 35 U.S.C. 119(e), of U.S. application Ser. No. 63/371,261, filed Aug. 12, 2022, which is incorporated herein by reference in its entirety for all purposes.

GOVERNMENT SUPPORT

This invention was made with government support under DMR1419807 awarded by the National Science Foundation, W911NF-13-D-0001 awarded by the U.S. Army Research Office, HDTRA1-20-2-0002 awarded by the Defense Threat Reduction Agency, and NA18OAR4170105 awarded by the National Oceanic and Atmospheric Administration. The government has certain rights in the invention.

BACKGROUND

There is growing interest in wearable technology. Wearable technology includes small electronic devices and interconnections worn close to and/or on the surface of the wearer's skin. Wearable technology can collect and process data related to the wearer's body. Wearable technology has a variety of applications, including activity tracking, physiological monitoring, medical intervention, fashion, entertainment, and gaming. A common wearable technology is the smartwatch, an activity tracker in the form of a wristwatch.

Electronic textiles are a form of wearable technology. Electronic textiles are fabrics that have one or more electronic components (e.g., batteries, lights, sensors, and/or microcontrollers) and interconnections embedded in them. Electronic fabrics are conventionally created by weaving or knitting bare interconnects with regular yarns or attaching electronic devices to the surface of the fabrics. However, these conventional electronic fabrics suffer from several drawbacks that have limited their adoption, including their lack of mechanical durability, lack of moisture protection, and limited conductor and device density.

SUMMARY

Conductive fibers with controlled elasticity can be used to create functional electronic textiles that are flexible and stretchable. Compared to weaving or knitting bare interconnects with regular yarns or attaching devices to the surface of fabric, encapsulating both interconnects and devices within the cladding of an elastic fiber confers mechanical and moisture protection while providing increased electrode and device density. Elastic conductive fibers have high electrical conductivity (e.g., >$10^6$ S m$^{-1}$ or >$10^7$ S m$^{-1}$) even when stretched, bent, or otherwise deformed. Elasticity aids the fabric construction process (e.g., weaving or knitting) without compromising the fiber's electrical properties. Elasticity also aids the fabric in withstanding daily use.

A fiber may include a cladding and at least one conductor (e.g., one, two, three, or more conductors) disposed in a single channel or respective channels formed in the cladding. The conductor may have a length longer than the length of the cladding by about 4% to about 100%. The conductor may have a buckled shape.

In some versions, the conductor in the fiber may have a length that is at least 20%, 50%, 75%, or 100% longer than the length of the cladding. The length of the fiber may be at least about 1000 times longer than the width of the fiber. The conductor may include two wires. The cladding may include at least two channels formed therein, and conductors may be disposed in respective channels. The fiber may include at least one device electrically coupled to the conductor and disposed in the channel. The device may be electrically coupled to the conductor in series. The device may be electrically coupled to two conductors in parallel in the channel. The device may include a diode, photodiode, light-emitting diode (LED), laser diode, photodetector, transistor, memory, processor, microcontroller, or a thermistor.

In some versions, the cladding may include a thermoplastic elastomer material. The thermoplastic elastomer material may include at least one of poly(styrene-b-(ethylene-co-butylene)-b-styrene), thermoplastic polyurethane, or cyclic olefin copolymer elastomer. The conductor may include a conductive metal. The conductive metal may include at least one of copper, tungsten, iron, aluminum, titanium, chromium, nickel, gold, or silver. The channel may have a cross-sectional diameter about 5 to about 500 times larger than the cross-sectional diameter of the conductor. The length of the conductor may be about 20% to about 30% longer than the length of the cladding. The fiber may have a diameter of about 1 mm to about 4 mm. A fabric may include the fiber described above woven or knitted into the fabric.

An inventive method of using a fiber includes (A) stretching the fiber by at least 15%, (B) relaxing the fiber, and (C) repeating steps (A) and (B) at least 2,000 times. The fiber may have a conductivity of at least $10^7$ S m$^{-1}$ and the fiber may have an electrical resistance change of less than 0.5% during steps (A), (B), and (C).

Another inventive method includes forming a fiber that includes a cladding and a portion of an electrically conductive wire disposed in a channel formed in the cladding, stretching the cladding along a longitudinal axis of the fiber to pull a second portion of the electrically conductive wire into the channel, and, after stretching the cladding, relaxing the cladding to induce buckling of the electrically conductive wire in the channel.

Another inventive method includes forming a fiber that includes a cladding and a portion of an electrically conductive wire disposed in a channel formed in the cladding so that the channel is off-set from a central axis of the cladding. The method also includes annealing the fiber at a temperature of about 20° C. below a melting point of the cladding, and, while annealing the fiber, twisting the fiber to induce a helical shape in the electrically conductive wire. The method also includes, after annealing the fiber, untwisting the fiber without removing the helical shape in the electrically conductive wire.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally and/or structurally similar elements).

DETAILED DESCRIPTION

Figure 1:
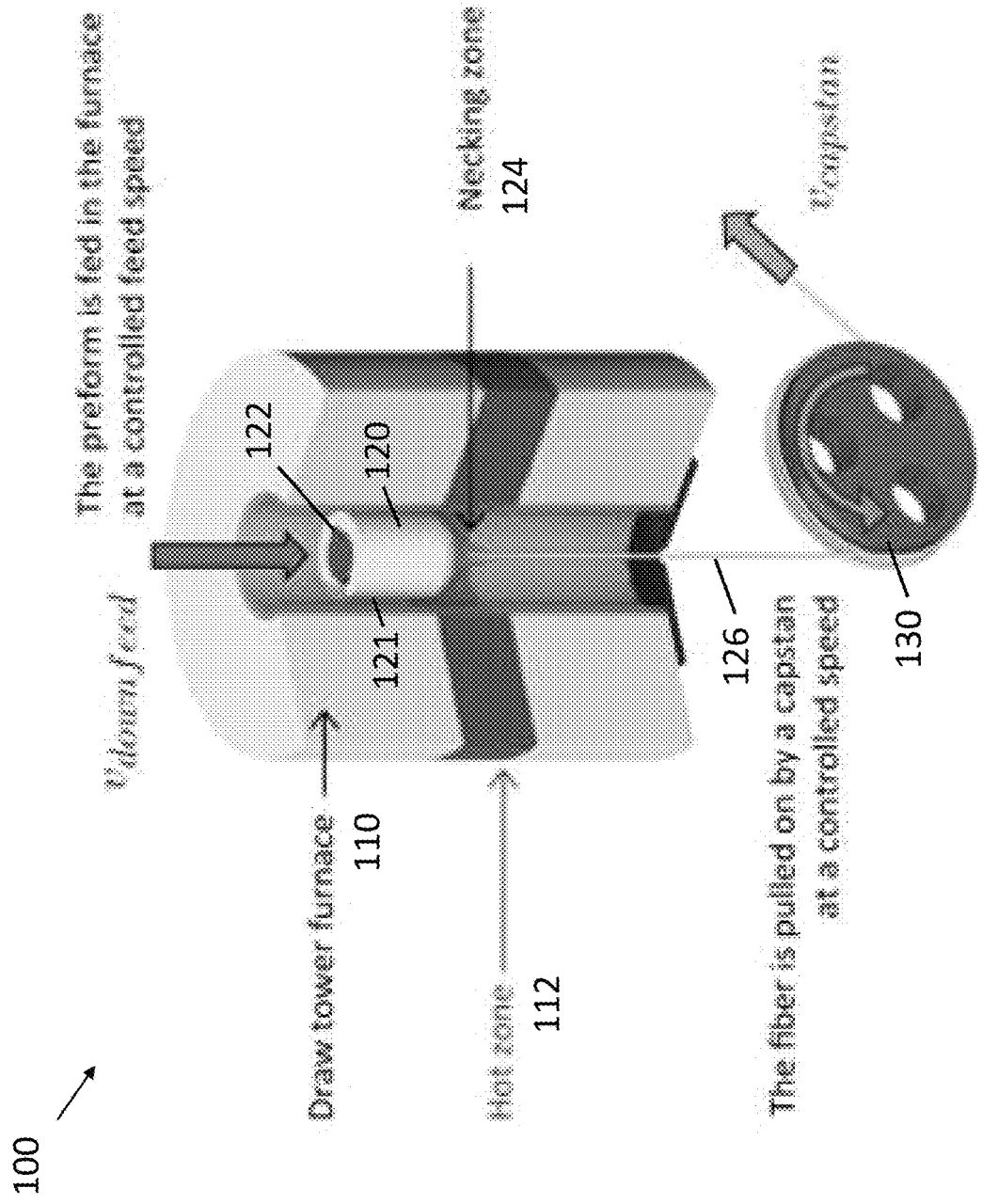
FIG. 1 illustrates a conventional thermal drawing apparatus for forming a conductive fiber.

The elastic conductive fibers and electronic fabrics disclosed herein have both electrical conductivity and elastic recovery. Two approaches to forming elastic conductive fibers are disclosed, each of which may result in a conductive fiber that can stretch, bend, or elongate by up to about 50% without substantially changing the fiber's electrical resistance (e.g., without changing the fiber's electrical resistance by more than about 0.5%). The first approach includes inducing a buckling instability in a conductor (e.g., a metal microwire) within a cavity or channel formed along the length of a thermally drawn elastomer fiber. The elastic conductive fiber produced with the first approach is called a buckled conductive fiber. The second approach includes twisting an elastomer fiber to yield helical metal conductors embedded in a thermally drawn elastomer fiber. The elastic conductive fiber produced with the second approach is called a helical conductive fiber.

The scalability of both approaches is illustrated in apparatuses for continuous buckling and twisting, respectively, described in detail below. The apparatuses may produce tens of meters of elastic conductive fibers. Geometric parameters, such as buckling pre-strain and helical angle, as well as materials choice, may determine the fiber's elasticity and its Young's modulus. The resulting fibers may be made into electronic fabrics by, for example, weaving and/or knitting and may include electronic devices (e.g., diodes, photoresistors, photodiodes, light emitting diodes, laser diodes, photodetectors, transistors, memory chips, processors, batteries, capacitors, microcontrollers, and/or thermistors) encapsulated in the fibers.

An inventive elastic conductive fiber has a cladding (also called a fiber body) surrounding one or more conductors. The cladding material is a material that can flow at the temperature selected for thermally drawing the conductive fiber. The cladding may be a thermoplastic elastomer. For example, the cladding material may be cyclic olefin copolymer elastomer (COCe), thermoplastic polyurethane, and/or poly(styrene-b-(ethylene-co-butylene)-b-styrene) (SEBS). The conductor may be made of any suitable conductive metal (e.g., copper, tungsten, iron, aluminum, titanium, chromium, nickel, gold, or silver) or conductive polymer (e.g., polyaniline or polypyrrole). The conductor may include a piezoelectric material to harvest energy from movement of the fabric into which the conductive fiber has been integrated. For example, the piezoelectric material may harvest energy as a person wearing the fabric moves around.

The elastic conductive fiber has an elongated structure with a longitudinal dimension that is substantially larger (e.g., 1000 times longer) than the other two fiber dimensions. For example, the length of the fiber may be about 1 meter (m) to about 100 m (e.g., 1 m, 10 m, 20 m, 50 m, or 100 m). The cross-sectional dimensions of the fiber may be about 1 millimeter (mm) to about 10 mm (e.g., 1 mm, 2 mm, 5 mm, or 10 mm). The fiber cross-section may have any shape (e.g., rectangular, circular, elliptical, or triangular) and can be chosen, in part, by shaping the preform that is then drawn into the fiber. The fiber cladding may include a channel disposed therein having a cross-sectional area of about 50 µm 2 to about 1 mm². The conductor may be disposed in the channel. The conductor may be a wire or a ribbon having a diameter or width of about 5 µm to about 100 µm. An elastic conductive fiber is mechanically flexible (e.g., flexible enough to be coiled around a spool or made into a flexible fabric), elastic, and durable. An elastic conductive fiber can be repeatedly stretched longitudinally so that the fiber's length is greater than the fiber's length in a relaxed state and, while doing so, maintain high conductivity and little or no change in electrical resistance through the elastic conductive fiber. As an example, an elastic conductive fiber may be stretched to a length about 2% to about 50% (e.g., 2%, 5%, 10%, 15%, 20%, 30%, 40%, or 50%) greater than the fiber's relaxed length and then relaxed for at least 100 to at least 5000 repetitions (e.g., 100, 500, 1000, 2000, or 5000) and maintain a conductivity of at least $10^7$ S $m^{-1}$ with less than 0.5% change in electrical resistance over the repetitions.

FIG. 1 illustrates a conventional thermal drawing apparatus 100 for forming a conventional conductive fiber 126. To form the conventional conductive fiber 126, a preform 121 including a preform cladding 120 around a conductive element 122 (also called a conductor) are fed into a draw tower furnace 110. The draw tower furnace 110 includes a hot zone 112. The preform 121 is pulled through the draw tower furnace 110 past the hot zone 112 by a capstan 130 moving at a controlled speed. There is a necking zone 124 in the preform 121 as the preform 121 is drawn through the hot zone 112 of the draw tower furnace 110. This conventional thermal drawing process produces a conventional conductive fiber 126 with a cladding surrounding a straight conductor. The elasticity of the conventional conductive fiber 126 is limited by the elasticity of the conductor, making it unsuitable for applications where the fiber may be stretched. For example, if the conventional conductive fiber 126 is woven into a wearable garment, stretching of the garment due to normal wear may stretch the conventional conductive fiber 126, causing tensile strain in the conductor and increasing the conventional conductive fiber's electrical resistance or even causing the conductor to break, thereby severing the electrical connection.

Buckled Conductive Fibers

Figure 2:
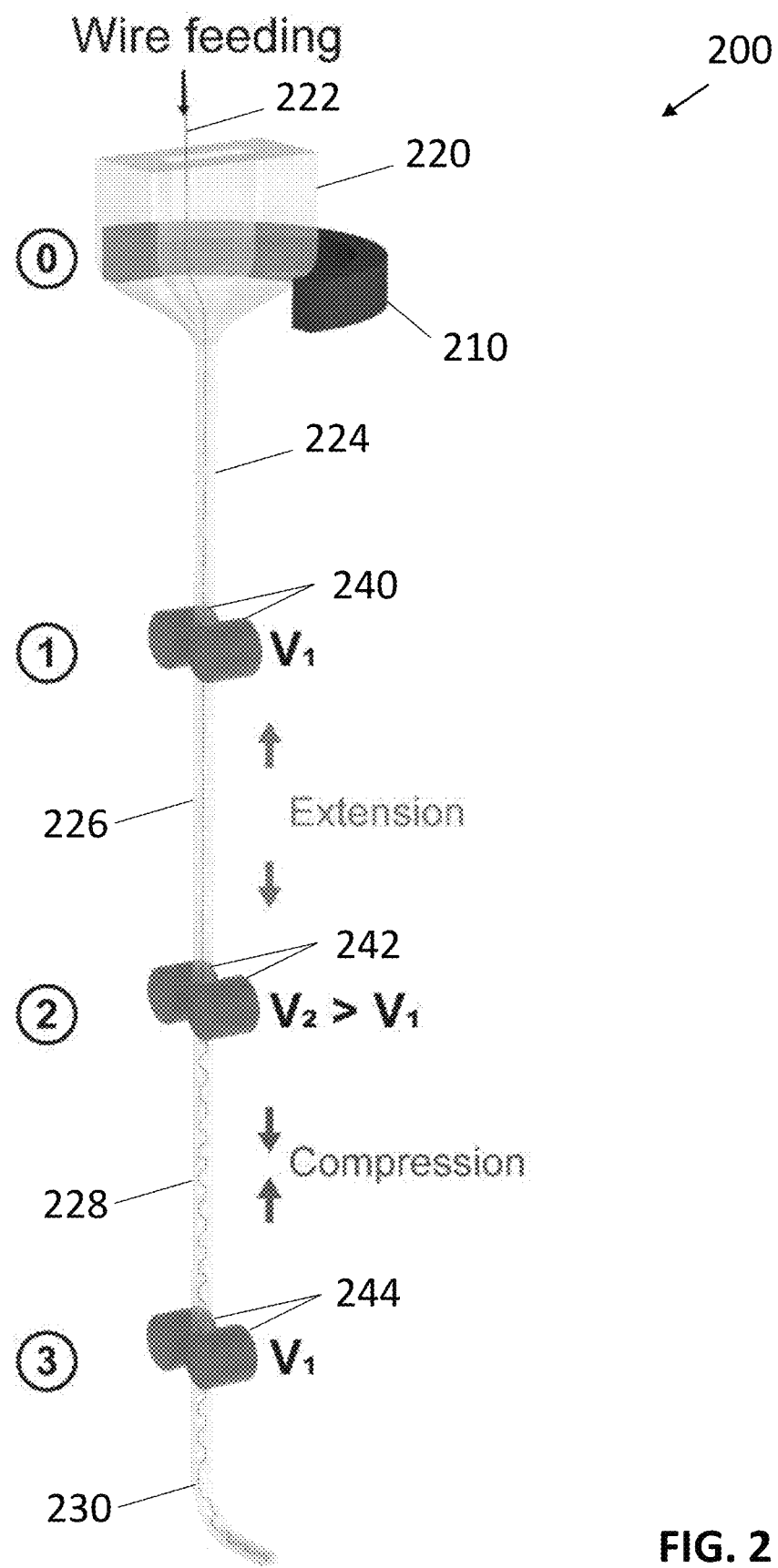
FIG. 2 illustrates a thermal drawing apparatus for forming an elastic conductive fiber with a buckled conductor (also called a buckled conductive fiber).

FIG. 2 illustrates a thermal drawing apparatus 200 for forming a buckled conductive fiber 230. The apparatus 200 includes a draw tower furnace with a hot zone 210 through which a preform 220 is drawn. The preform 220 includes a hollow internal channel in which a conductor 222 (e.g., a conductive wire or conductive ribbon) is fed into the preform 220 as the preform 220 is fed through the draw tower. This part of the process creates an intermediate conductive fiber 224 with a cladding around the straight conductor, somewhat similarly to the conventional drawing process. A difference between the intermediate conductive fiber 224 and a conventional conductive fiber is that the intermediate conductive fiber 224 includes an internal channel (also called a cavity, a channel, a hollow, a conduit, or a tunnel) in which the conductor 222 is disposed. The internal channel has at least one cross-sectional dimension that is about 5 to about 500 times larger than a cross-sectional dimension of the conductor so that the conductor has room to buckle, as described in more detail below. The intermediate conductive fiber 224 has very little elasticity and is limited by the elasticity (or lack thereof) of the conductor.

The thermal drawing apparatus 200 also includes three sets of rollers 240, 242, and 244. The intermediate conductive fiber 224 is fed through the three sets of rollers 240, 242, and 244, which rotate in the same direction but at different linear speeds, to extend, lengthen, or stretch conductive fiber 226 between the first and second sets of rollers and to compress conductive fiber 228 between the second and third sets of rollers. The second set of rollers 242 pulls the fiber 226 at a higher linear speed (V2) than the first set of rollers 240 (V1), stretching the fiber's cladding by a ratio equal to V2/V1. The first set of rollers 240 may hold the fiber 226 without pinching it too much, so that the channel internal to the fiber does not collapse and the conductor 222 may slide within the channel. The second set of rollers 242 can pinch the fiber hard enough to collapse the channel to prevent the conductor 222 from sliding relative to the fiber 226. The set of rollers 242 may simultaneously pull on the fiber 226 and on the conductor 222. Stretching the fiber causes an additional length of conductor to be pulled into the cladding's internal channel from upstream of the rollers. The cladding in the conductive fiber 226 in this section of the thermal drawing apparatus 200 is extended, stretched, or lengthened, and the amount of extension, stretching, or lengthening is proportional to the ratio of the speed of the second set of rollers 242 compared to the speed of the first set of rollers 240. The speed of the first set of rollers (V1) may be about 0.25 meters per minute (m/min) to about 10 m/min. The speed of the second set of rollers (V2) may be about 2% to about 50% faster than the speed of V1 (e.g., 2%, 4%, 6%, 8%, 10%, 12%, 15%, 20%, 25%, 30%, 35%, 40%, 45%, or 50%). As an example, V1 may be 1.58 meters per minute (m/min) and V2 may be 1.71 m/min.

The third set of rollers 244 pulls the fiber at a lower speed (V1) than the second set of rollers 242 (V2). The slower rotation of the third set of rollers 244 relaxes the elastic strain in the cladding in the portion of conductive fiber 228 between rollers 242 and 244. The third set of rollers 244 can pinch the fiber hard enough to collapse the channel, preventing the conductor 222 from sliding within the channel. Relaxation of the fiber causes a compressive load on the conductor 222 in this portion of the conductive fiber 228 that forces the conductor 222 to buckle inside the channel of the cladding. In other words, this process induces a buckling instability to create a wavy path for the conductor 222 disposed in the hollow channel internal to the cladding.

This process leads to a buckled conductive fiber 230 with a conductor trace length, $L_{conductor}$, that is longer than the fiber length, $L_f$, giving an excess conductor length $\eta_{conductor}$:

$$\eta_{conductor} = \frac{L_{conductor} - L_f}{L_f}$$

Because the buckled conductive fiber 230 has this excess conductor length $\eta_{conductor}$, the buckled conductive fiber can stretch or elongate by an amount up to the excess conductor length $\eta_{conductor}$ without substantially changing the fiber's electrical properties. When the elongation is smaller than $\eta_{conductor}$, the buckled conductive fiber 230 exhibits the same or substantially similar tensile properties as the cladding without a conductor. If the cladding is elastomeric, the buckled conductive fiber 230 acts like an elastomer without substantially changing the buckled conductive fiber's electrical conductivity up to an extension equal to about $\eta_{conductor}$, defining an elastic range. For example, the resistance of the buckled conductive fiber 230 may vary by less than 0.5% in its elastic range. For elongations exceeding $\eta_{conductor}$, the tensile properties of the buckled conductor 222 dominate until the buckled conductor 222 breaks.

To form the buckled conductor 222, the cladding with an initial length $L_0$, is stretched around the conductor to a length $L_{conductor}$, yielding a strain:

$$\varepsilon_{clad} = \frac{L_{conductor} - L_0}{L_0}.$$

The final length of the fiber, $L_f$, may be longer than $L_0$, resulting in the excess length of conductor in the final structure $\eta_{conductor}$ as defined above, which may be less than $\varepsilon_{clad}$. The excess length may be, in part, due to the incomplete recovery of the cladding itself upon relaxation.

Additionally, during the relaxation stage, the compression of the conductor gives rise to a reaction force that opposes the elastic recovery force in the cladding, leading to a final equilibrium between these two forces. This effect may, in part, result in the incomplete recovery of the cladding. The tensile behavior of the buckled conductive fiber depends on the cladding material and $\eta_{conductor}$, which controls the point where the stress-strain curve diverges during elongation from the tensile behavior of the cladding material. The equilibrium between the recovery force in the cladding and the buckling forces determines $L_f$, and thus $\eta_{conductor}$. For a given cladding and fiber geometry, $\eta_{conductor}$ may depend approximately linearly on $\varepsilon_{clad}$ up to 50% strain in the cladding.

During formation of the buckles in the conductive fiber, buckles in the conductor may form in successive steps. For example, during relaxation by the third set of rollers 244, as the compressive strain on the conductor increases, the straight conductor buckles into the first mode. The buckle grows until it touches the opposite wall of the cladding, creating a contact point between the conductor and the cladding at which the conductor touches the inner wall of the cladding/channel. The increasing compressive strain then forms a contact zone until a new bifurcation point in the conductor is reached and the contact zone snaps into a new buckle in the conductor. For a given compressive strain, the calculated force depends linearly on the conductor's bending stiffness. The value of $\eta_{conductor}$ may decrease as the conductor becomes stiffer. For example, a tungsten conductor, with a Young's modulus of 400 GPa, yields a smaller $\eta_{conductor}$ than a copper conductor with a Young's modulus of 110 GPa when buckled under the same conditions.

The buckling force of the conductor may depend on the diameter or width of the channel in the cladding. As the diameter of the channel decreases, the buckling force may increase, resulting in smaller $\eta_{conductor}$ values. This trend may not be present in conductive fibers with large channel diameters (e.g., channel sizes greater than 500 µm). The length of the buckling fiber may not influence the buckling force.

The mechanical properties of the cladding material may influence buckling. Cladding materials with higher Young's modulus and higher recovery strain may have higher recovery forces and therefore higher $\eta_{conductor} \cdot \eta_{conductor}$ values may be about 2% to about 50% (e.g., 2%, 5%, 8%, 10%, 15%, 20%, 25%, 30%, 40%, or 50%).

Figure 3:
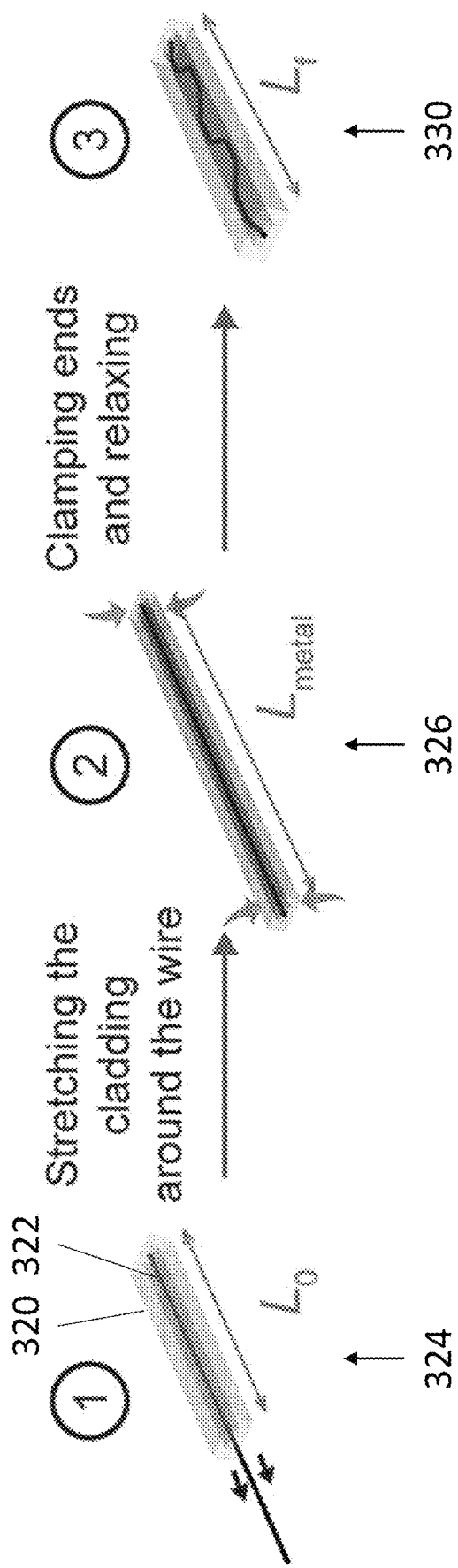
FIG. 3 illustrates steps to form a buckled conductive fiber.

FIG. 3 illustrates a process to form a buckled conductive fiber 330 without the thermal drawing apparatus in FIG. 2. The process starts with a conductive fiber 324 having an elastomeric cladding 320 around a straight conductor 322 in a channel whose diameter (maximum cross-sectional dimension) is larger than the straight conductor's diameter (maximum cross-sectional dimension). The cladding 320 is stretched along the conductor 322 to form a stretched fiber 326. The stretched fiber 326 with the stretched cladding is then clamped at one or both ends to hold the cladding and the conductor together. The stretched cladding is then relaxed, causing the conductor 322 to buckle inside of the cladding, thereby forming the buckled conductive fiber 330. The cladding stretching process shown in FIG. 3 can be done manually or using a motor (e.g., a stepper motor). Additional lengths of buckled conductive fiber 330 can be made by repeating the process.

The processes downstream of the draw tower shown in FIGS. 2 and 3 to form the buckled conductive fiber can be performed concurrently with the step of drawing the conductive fiber. This may be preferable for continuous processing. Alternatively, the processes shown in FIGS. 2 and 3 can be decoupled from the step of drawing the conductive fiber. In other words, one may form or acquire a conductive fiber comprising a channel containing a freestanding conductor and then, at a later time, transform this conductive fiber into a buckled conductive fiber using the processes in FIG. 2 or 3 (downstream of the draw tower). The decoupled approach may be preferable for batch processing.

Figure 4:
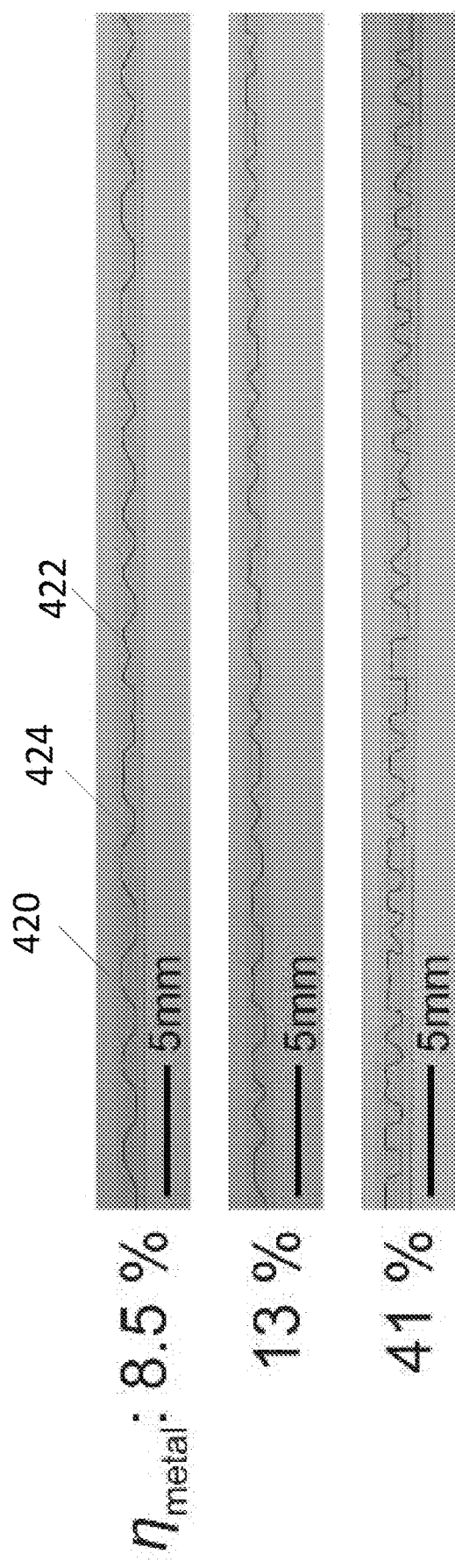
FIG. 4 shows three buckled conductive fibers with different excess conductor lengths.

FIG. 4 shows three buckled conductive fibers with different excess conductor lengths $\eta_{conductor}$. Each buckled conductive fiber include a cladding 420, a channel 424 formed therein, and a conductor 422. The amount of elasticity of the conductive fiber can be controlled, in part, by changing the excess conductor lengths $\eta_{conductor}$, with higher elasticity with higher $\eta_{conductor}$. The three different buckled conductive fibers in FIG. 4 have $\eta_{conductor}$ equal to (from top to bottom) 8.5%, 13%, and 41%. Higher $\eta_{conductor}$ values correspond with more conductor buckling within the cladding.

Figure 5:
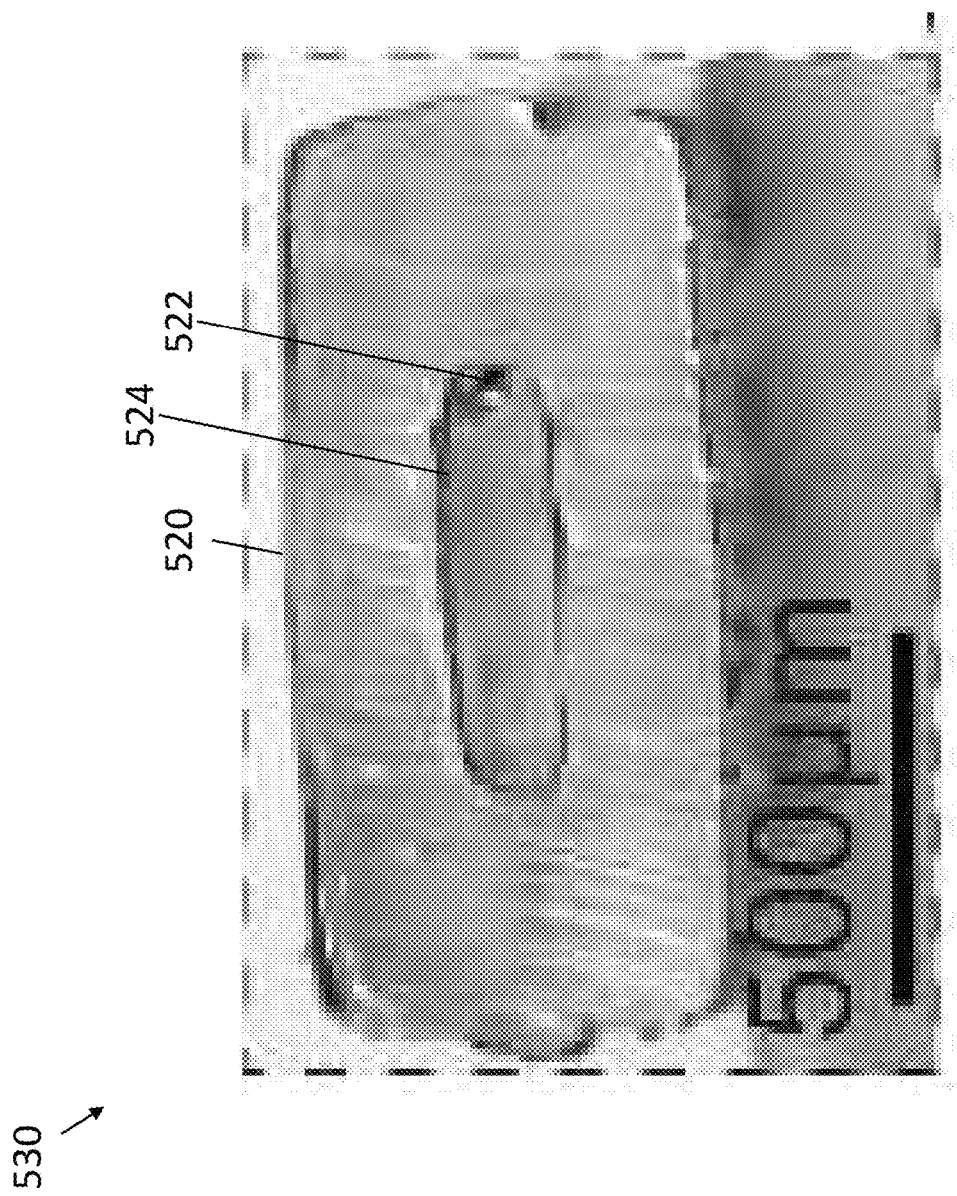
FIG. 5 is a cross-sectional view of a buckled conductive fiber.

FIG. 5 is cross-sectional view of a buckled conductive fiber 530. The buckled conductive fiber 530 includes a cladding 520, and channel 524 formed in the cladding, and a buckled conductor 522 disposed in the channel. The buckled conductor 522 is fully protected from the external environment of the fiber by the cladding 520 so that the buckled conductive fiber 530 can operate in a range of environments. In this way, the cladding 520 forms a protective housing around the conductor 522. The buckled conductive fiber 530 in this example has a rectangular cross-sectional shape, but the conductive fiber may have any cross-sectional shape (e.g., circular, square, or ovular).

Helical Conductive Fibers

Figure 6:
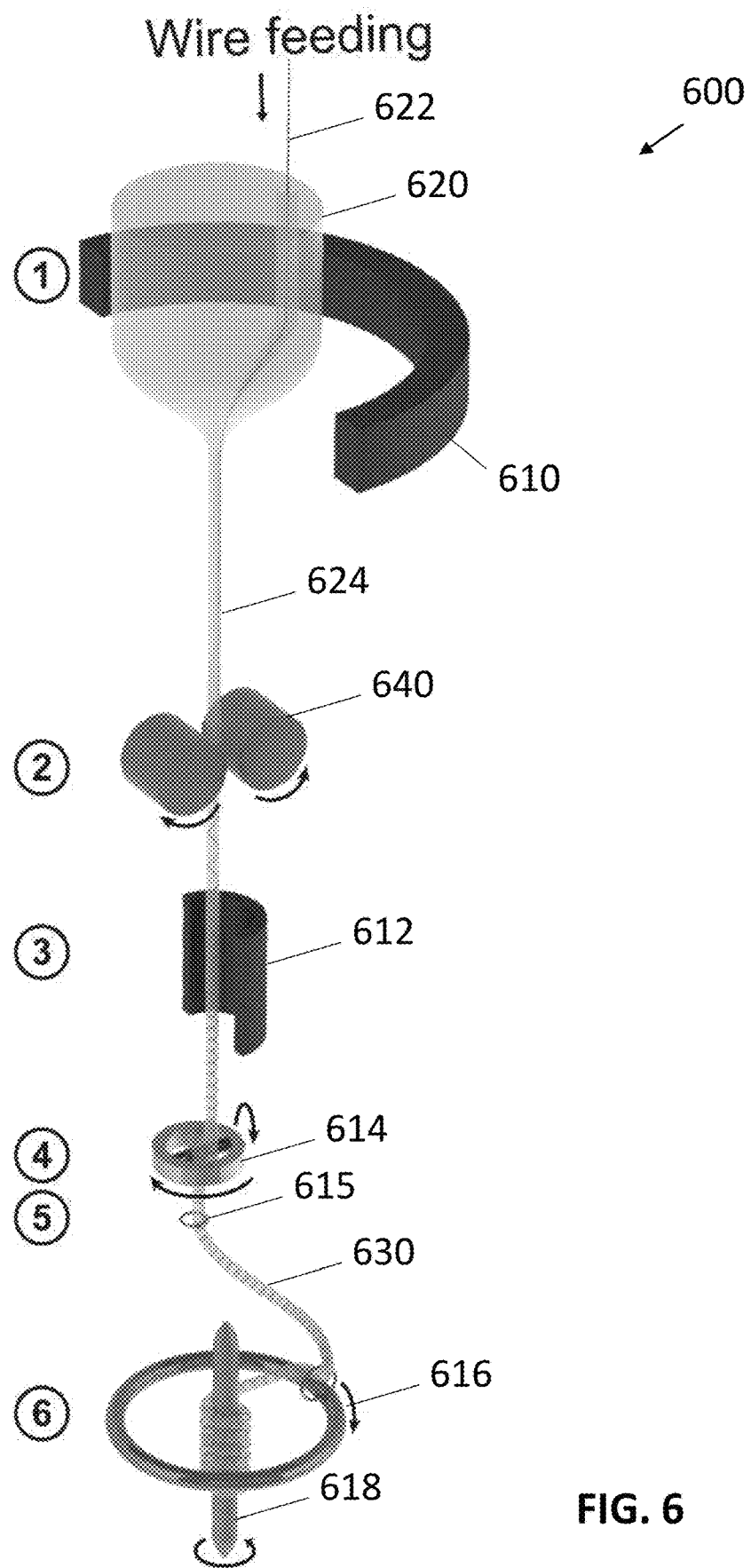
FIG. 6 illustrates a thermal drawing apparatus for forming an elastic conductive fiber with a helical conductor (also called a helical conductive fiber).

FIG. 6 illustrates a thermal drawing apparatus 600 for forming a helical conductive fiber 630. The apparatus 600 deforms the cladding and the conductor simultaneously to create a helically wound conductor in a channel in the cladding of the fiber. The apparatus 600 includes a draw tower furnace with a hot zone 610 through which a preform 620 is drawn. The preform 620 includes a hollow internal channel offset from the central linear axis of the preform 620. A conductor 622 is fed into the offset channel in the preform 620 as the preform 620 is fed through the draw tower to form an intermediate conductive fiber 624. The thermal drawing apparatus 600 includes a pair of rollers 640 to pull the fiber through the draw tower furnace. The fiber is fed through the pair of rollers 640, with each roller in the pair of rollers rotating in opposite directions but at the same speed. This part of the process creates the intermediate conductive fiber 624 with a cladding around a straight conductor, with the straight conductor offset from the central axis of the fiber. The intermediate conductive fiber 624 has very little elasticity, limited by the elasticity (or lack thereof) of the conductor.

To form the helical conductive fiber, the apparatus 600 includes an annealing furnace 612, a false twisting device 614, a guiding ring 615, a ring spinner 616 and a rotating pin 618. The intermediate conductive fiber 624 goes through the annealing furnace 612 and then the false twisting device 614 to imprint a twisting deformation.

Conventionally, a false twisting device 614 inserts a twist in the middle of a fiber so that the sections of the fiber upstream and downstream of the false twisting device 614 are twisted in opposite directions and as a result the fiber has no net twist after travelling through the false twisting device 614. When the false twisting device 614 is paired with the annealing furnace 612, the pair can introduce a permanent deformation in a fiber. The annealing furnace 612 is held at a temperature of about 10° C. to about 30° C. below the melting point of the cladding (e.g., about 20° C. below the melting point of the cladding). The false twisting device 614 is a rotating pin, with the pin rotating around its own axis and around the fiber's central linear axis so that the fiber travels around the pin's axis and twists around the fiber's central linear axis. The false twisting device 614 twists and untwists the fiber. The stress accumulation in the cladding during twisting relaxes during annealing, setting the shape of the fiber and creating a helical conductor within a linear cladding.

After moving through the false twisting device 614, the fiber is guided by the guiding ring 615 to a ring spinner 616 around a rotating pin 618. The ring spinner 616 is a real twister that counters the twisting induced by the false twisting device 614. The ring spinner 616 both twists and pulls the fiber and the rotating pin 618 pulls the fiber. The fiber undergoes a permanent twisting upstream of the false twisting device 614 that is induced by the combination of the false twisting device 614 and the annealing furnace 612. The fiber undergoes an impermanent reverse twisting downstream of the false twisting device 614 which is canceled by the twist induced by the ring spinner 616. As a result, the conductor within the resulting helical conductive fiber 630 exhibits the amount of twist imposed upstream by the false twisting device 614.

The apparatus 600 can be used for both batch processing, where the fiber is first twisted and then held in the annealing furnace 612 without traveling, or for continuous processing, where the fiber is continuously pulled, twisted, and annealed. The apparatus 600 can be mounted in the continuity of the draw for scalable continuous manufacturing of helical conductive fibers.

Excessive twisting of the fiber during fabrication can result in a torsional instability, which causes the fiber to lose its linearity. However, successive small steps of twisting and annealing can help mitigate this issue. For example, the conductive fiber may be fed through the twisting components in the apparatus 600 multiple times to form the desired pitch of the helix conductor in the helical conductive fiber.

A helical conductive fiber may alternatively be formed by twisting the intermediate conductive fiber 624 by hand, and then annealing the conductive fiber in an oven while holding the twist in the intermediate conductive fiber 624. These two steps of (hand-)twisting and annealing may be repeated as many times as desired to form the desired pitch of the helix conductor in the helical conductive fiber.

The elasticity of the helical conductive fiber 630 is controlled, in part, by the pitch of the conductor's helix. The pitch of the helix is determined by the operation of the false twisting device 614. In static batch processing, the pitch of the helix is given by the number of turns of the pin in the false twisting device 614 divided by the distance between the pair of rollers 640 and the pin in the false twisting device 614. In continuous processing, the pitch of the helix is given by the twisting speed of the pin (turns per minute) divided by the pulling speed of the pair of rollers 640 (meters per minute).

The excess conductor length in a helical conductive fiber, $\eta_{conductor}$, is dictated by the pitch (p) and diameter (r) of the corresponding helix, $$\eta_{conductor} = \sqrt{1 + \left(\frac{2\pi r}{p}\right)^2} - 1.$$

Helical conductive fibers exhibit two regimes of stress-strain behavior. At small strains, the stress of a helical conductive fiber increases linearly, and is higher than that of the pure elastomeric fibers. Following a yield-like stress rollover, the stress increases with a lower slope, until the wire breaks. The strain at the inflection point is noticeably different from $\eta_{conductor}$.

In a helical conductive fiber, the conductor may not slip relative to the cladding, so n $\eta_{conductor}$ may not be as indicative of the fiber's tensile behavior as in the buckled conductive fiber. Under tensile deformation, the radius of the conductor helix decreases, and the cladding deforms into a helical configuration to accommodate the compression. For the helical conductive fiber, the geometry of the fiber may be defined by the initial radius (r) and pitch (p) of the helix, and the thickness (t) of the outer layer of the cladding. The geometry of the helical conductive fiber influences its strain behavior under stress.

A geometric parameter that influences mechanical properties of a helical conductive fiber is the initial angle $\alpha_0$ between the helical conductor and the cross section of the fiber, which is given by:

$$\alpha_0 = \tan^{-1}\left(\frac{p}{2\pi r}\right).$$

For a given conductor and cladding material, ao may control the yield strain linearly, capturing the combined effects of p and r. The yield strain is defined here as the point of elongation stress at which plastic deformation of the conductor occurs. The electrical resistance of the helical conductive fiber is approximately static with increasing elongation up until the point of yield strain, where the conductor is plastically deformed. As $\alpha_0$ increases, the yield strain may decrease linearly. For large $\alpha_0$, the radius of the helix may decrease faster upon tensile strain, leading to a quicker yield. The thickness t of the outer layer of the cladding may not meaningfully affect the yield strain. A cladding material having a higher elastic modulus has a lower yield strain than a cladding material having a lower elastic modulus.

The helical conductive fiber may include a hollow core within the conductor helix to increase the fiber's yield strain. The helical conductive fiber with a hollow core accommodates a smaller pitch and hence a smaller wrapping angle.

Figure 7:
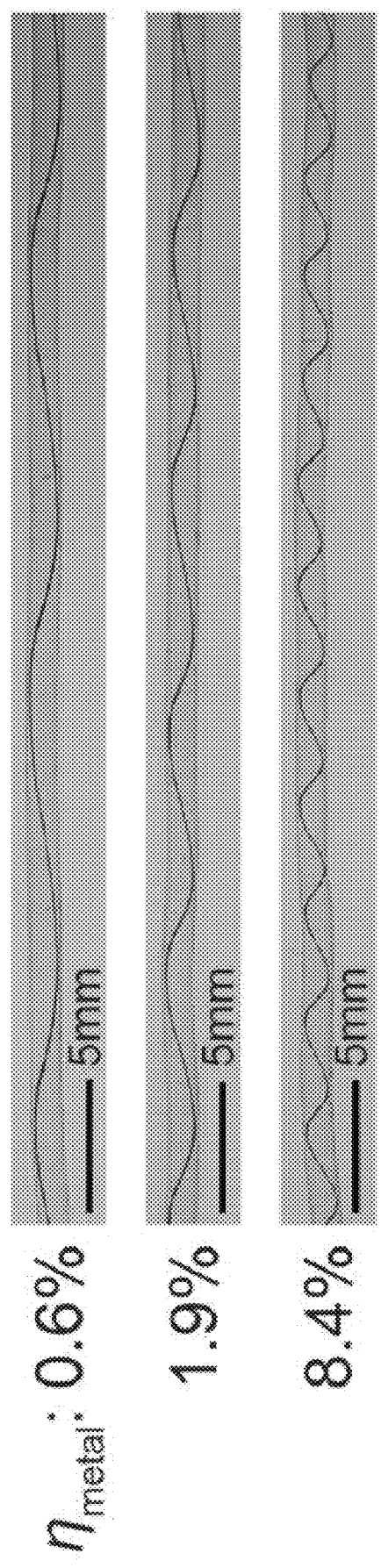
FIG. 7 illustrates three helical conductive fibers with different excess metal lengths.

FIG. 7 shows three helical conductive fibers with different helical pitches and different excess conductor lengths $\eta_{conductor}$. The amount of elasticity of the helical conductive fiber can be controlled by changing the helical pitch and thereby the $\eta_{conductor}$, with high pitches having higher $\eta_{conductor}$ and higher elasticity. The three helical conductive fibers in FIG. 7 have $\eta_{conductor}$ equal to (from top to bottom) 0.6%, 1.9%, and 8.4%.

Figure 8:
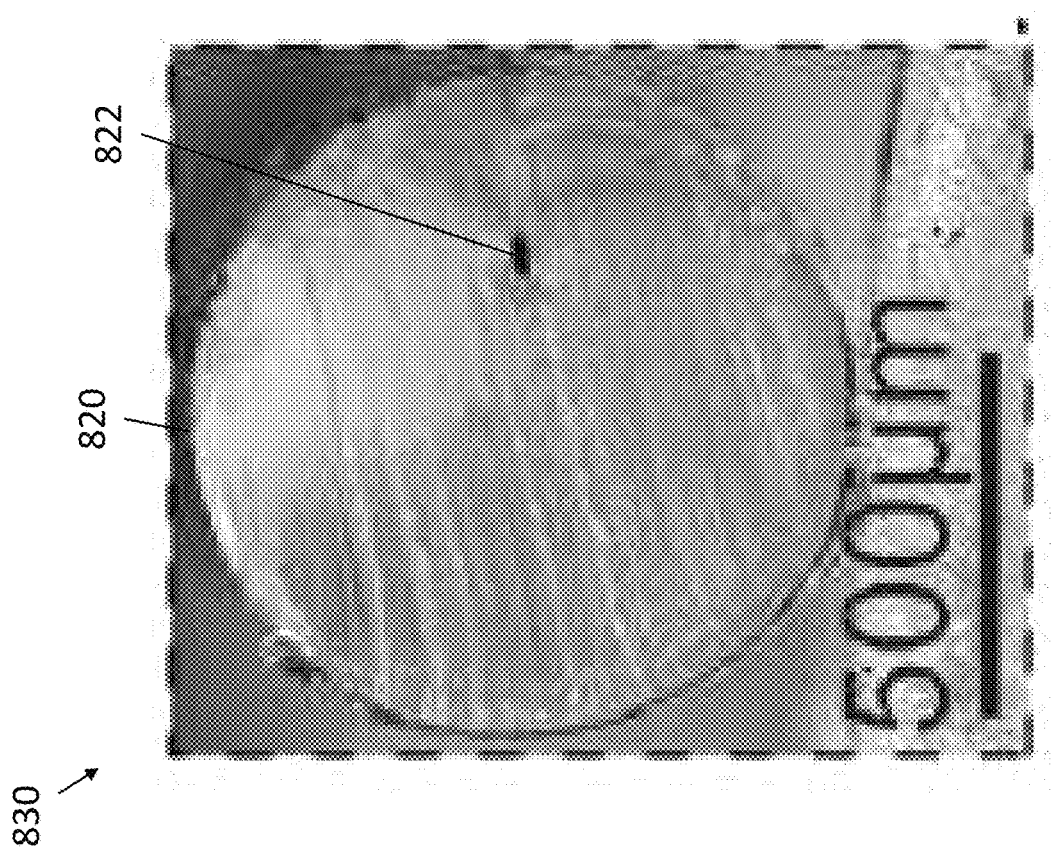
FIG. 8 is a cross-sectional view of a helical conductive fiber.

FIG. 8 is a cross-sectional view of a helical conductive fiber 830. The helical conductive fiber 830 includes a cladding 820 and a helical conductor 822 surrounded by the cladding 820. The helical conductor 822 is centered on and offset from the central linear axis of the fiber 830. The helical conductor 822 is fully protected from the external environment of the fiber by the cladding 820 so that the fiber 830 can be operated in a range of environments. In this way, the cladding 820 forms a protective housing around the conductor 822.

Multiple Conductor Conductive Fibers

One way to increase the density of conductors integrated into a single fiber is to integrate multiple conductors into the channel of the fiber. For example, 2-10 (e.g., 2, 3, 4, 5, 6, 7, 8, 9, or 10) wire conductors may be fed into the channel in the preform as the buckled conductive fiber or helical conductive fiber is formed. Each of the conductors in the channel may be insulated to prevent crosstalk or short-circuiting.

Figure 9A:
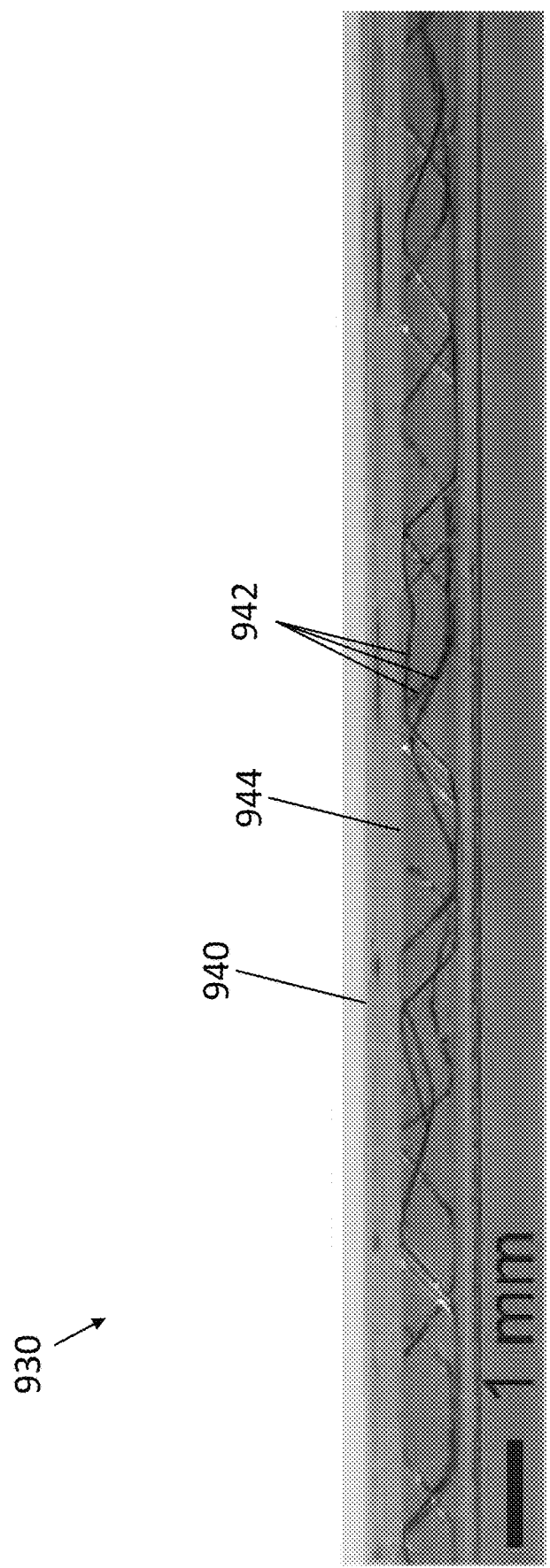
FIG. 9A is a side view of a buckled conductive fiber with multiple conductive elements in the same channel.

FIG. 9A is a side view of an example of a buckled conductive fiber 930 having multiple conductive elements 942 in a single channel 944 in the fiber's cladding 940. This example fiber 930 includes three conductive elements 942. Each of the conductive elements 942 are insulated prior to their incorporation in the buckled conductive fiber 930. The buckled conductive fiber 930 is prepared using the same processes described above with respect to forming a buckled conductive fiber with a single conductor disposed therein.

Another way to increase the density of conductors integrated into a single fiber is to integrate several channels into the fiber. Each channel may have a single conductor disposed inside of it or multiple insulated conductors disposed inside of it.

Figure 9B:
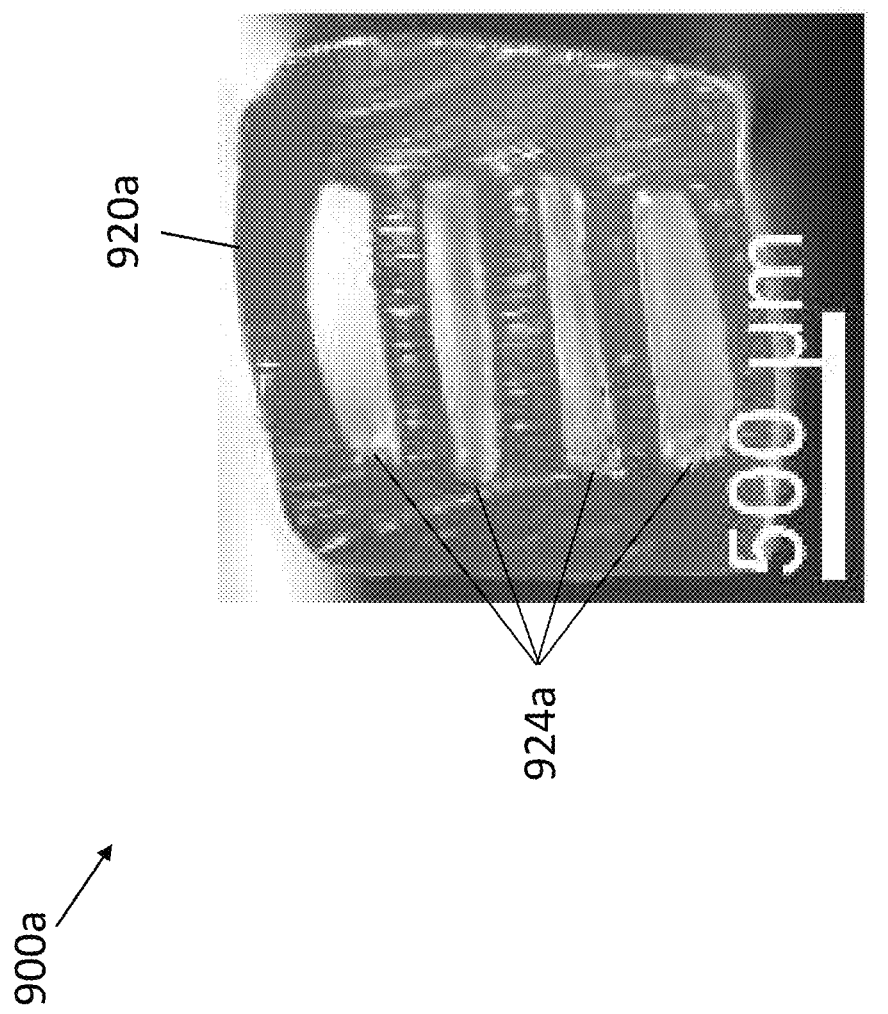
FIG. 9B is a cross-sectional view of the cladding of an elastic conductive fiber with multiple channels for multiple conductive elements.
Figure 9C:
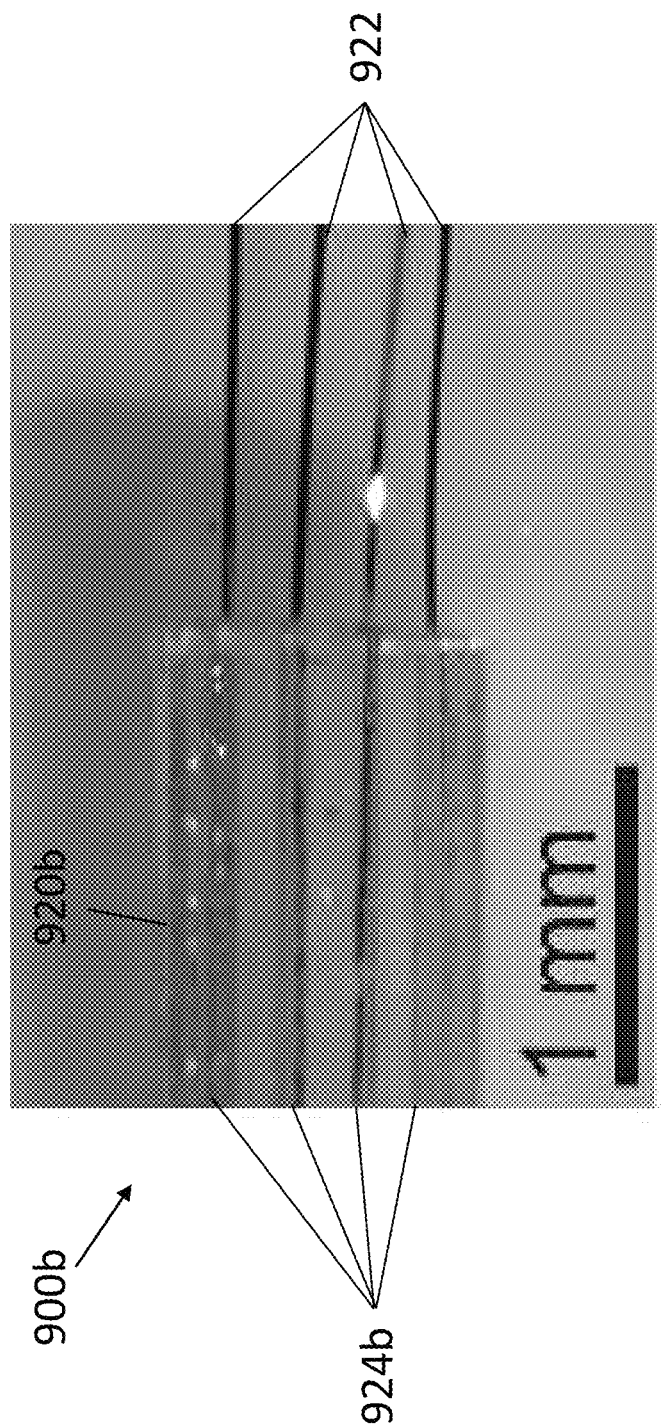
FIG. 9C is a side view of the elastic conductive fiber with multiple conductive elements in FIG. 9B.

FIG. 9B is a cross-sectional view of the cladding of an elastic conductive fiber 900a with four channels 924a in the cladding 920a, where each channel 924a may contain one or multiple conductors. In this case, the four channels in the conductive fiber 900a are stacked in a row, but they could be arranged in other ways instead, for example, to form a cross pattern or square array. FIG. 9C is a side view of the elastic conductive fiber 900b like that in FIG. 9B, with multiple conductive elements 922 disposed in respective channels 924b in the cladding 920b of the conductive fiber 900b.

Microdevices in Conductive Fibers

One or more microelectronic or photonic devices (also called microdevices) may be disposed in a buckled conductive fiber. Multiple microelectronic or photonic devices may be disposed at sites along the fiber's channel. The devices may be arranged in a linear sequence (i.e., in a daisy chain) along the fiber's channel and electrically connected via conductive wires or ribbons. There may be a space between adjacent devices in the buckled conductive fibers. At one or both ends of the buckled conductive fiber, one or more conductors in the fiber may be connected to a power supply or other circuitry for operation of the devices in the fiber.

The channel in the buckled conductive fiber has a cross-sectional area larger than that of the devices so that the devices may slide within the channel during formation of the buckled conductive fiber and during deformation of the formed fiber. In one version, one or more devices may be pinned in the channel to create a fixed position for the device in the fiber. The devices may be pinned in the channel by locally heating the (cladding of the) buckled conductive fiber at the desired location of the device to a temperature of about 20° C. below the melting point of the cladding. Once the conductive fiber is locally heated, the fiber is pinched at positions near one or both sides of the device to make the channel smaller in at least one dimension than a corresponding dimension of the device so that the device cannot move past the pinched point in the channel.

A buckled conductive fiber with one or more devices can be formed by forming a string of conductors and devices and then feeding the string into the draw tower furnace during the drawing process (e.g., as described with respect to FIGS. 2 and 6). The devices may have contact pads that are used to electrically connect the devices to one or more conductors. The resulting string of devices and conductor(s) is fed into the draw tower furnace with the preform to form a conductive fiber. The conductive fiber is then transformed into a buckled conductive fiber via one of the processes described above. The cladding of the buckled conductive fiber may encapsulate the device(s), contact pads, and at least a portion of the conductor(s) disposed along the length of the fiber.

Devices that may be disposed in a buckled conductive fiber include diodes, light emitting diodes (LEDs), photoresistors, thermistors, photodiodes, photodetectors, laser diode chips, microprocessors, memory chips, sensors, transistors, microcontrollers, and/or any other electronic or photonic device that has dimensions comparable to or smaller than those of the buckled conductive fiber channel (e.g., having dimensions less than 1.5 mm, less than 1 mm, or less than 0.5 mm). Any devices disposed in the conductive fiber may be electrically connected with conductors that act as interconnects.

Figure 10:
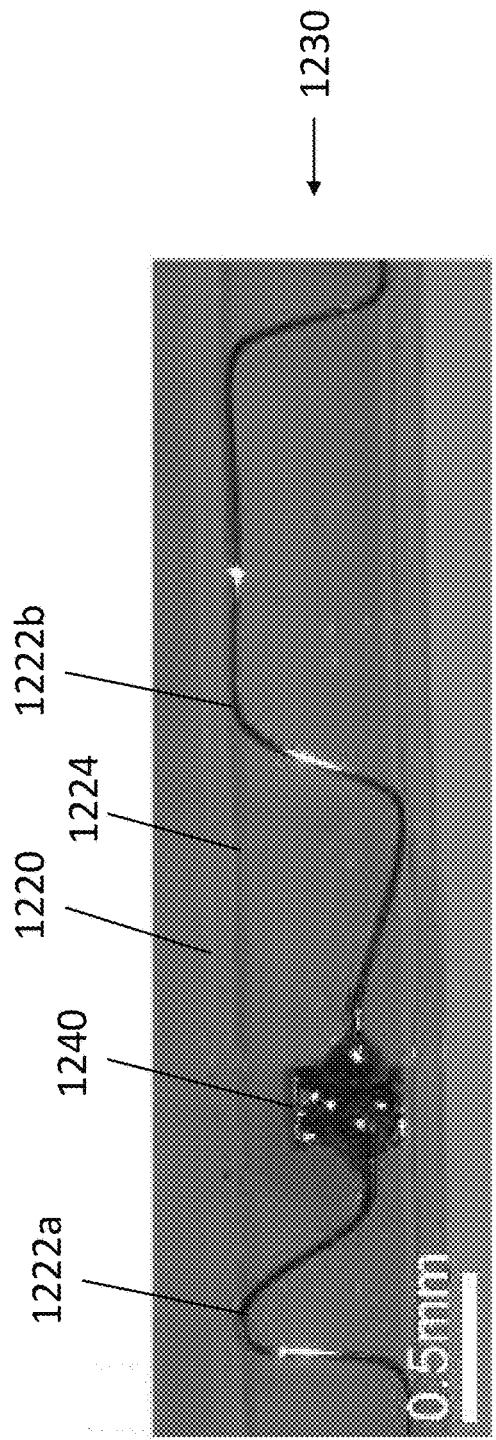
FIG. 10 shows a buckled conductive fiber with a micro light-emitting diode (μLED) connected in series with two buckled conductive elements in the fiber.

FIG. 10 shows a portion of a buckled conductive fiber 1230 having a μLED 1240 (also called a microLED, micro-LED, or mLED) connected in electrical series to two lengths of metal wire conductor 1222a and 1222b in the channel 1224 of the cladding 1220 of the fiber 1230. The cladding 1220 is a COCe polymer and the conductors 1222a and 1222b are metal wires each having a diameter of about 50 μm. The buckled conductive fiber 1230 has an $\eta_{conductor}$ of about 20%, and therefore may be reversibly elongated (elastically deformed lengthwise) by about 20% without substantially changing the conductive fiber's resistivity.

Figure 11:
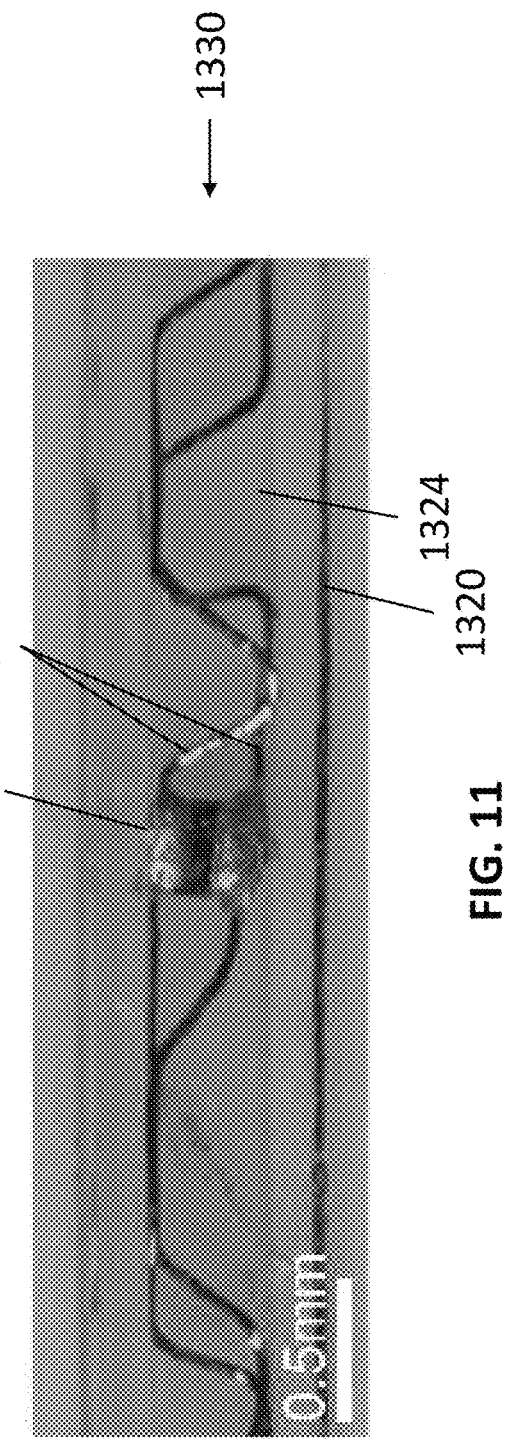
FIG. 11 shows a buckled conductive fiber with a μLED connected in parallel with two buckled conductive elements in the fiber.

FIG. 11 shows a buckled conductive fiber 1330 with a μLED 1340 connected in parallel to two insulated metal wire conductors 1322 in the channel 1324 of the cladding 1320 of the fiber 1330. The insulated metal wire conductors 1322 are coating with insulation except for bare patches that are connected to the μLED 1340 inside the channel 1324 in the fiber 1330. The cladding 1320 is a COCe polymer and the conductors 1322 are metal wires having a diameter of about 50 μm.

Figure 12:
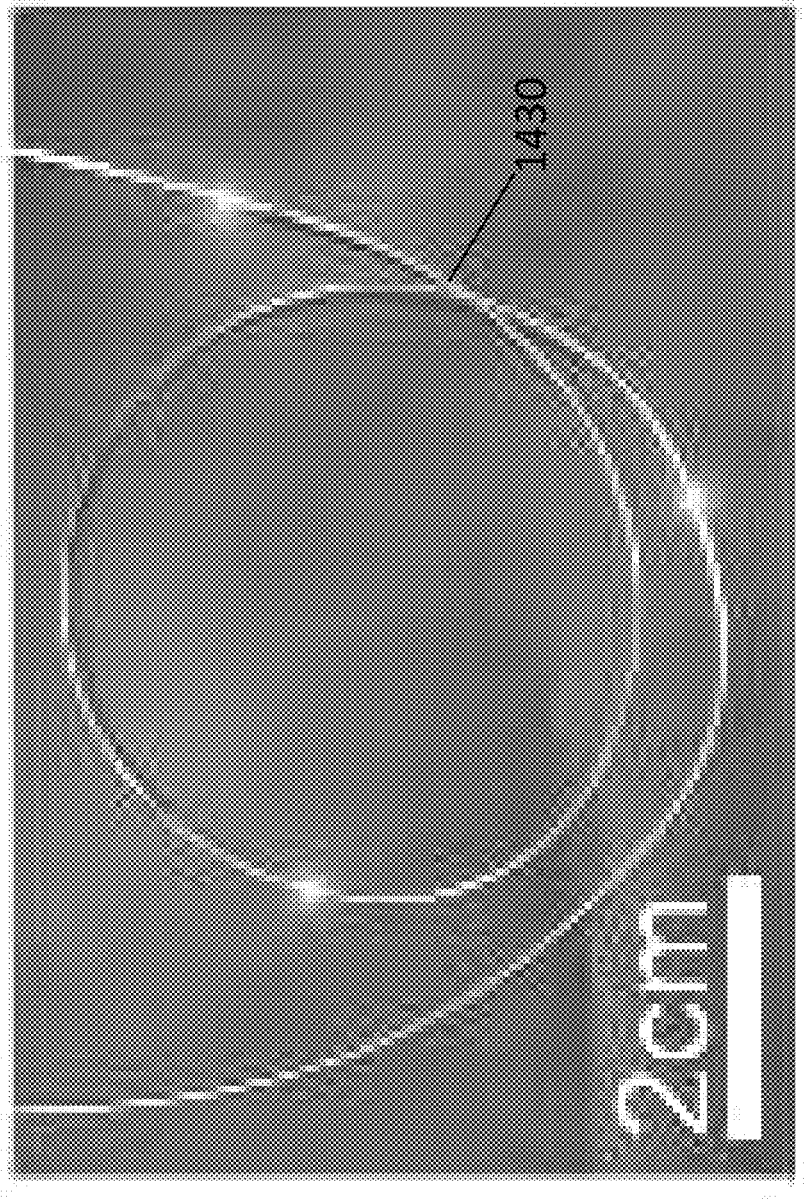
FIG. 12 shows an elastic conductive fiber with multiple μLEDs.

FIG. 12 shows a buckled conductive fiber with multiple μLED elements connected in series in the fiber. The buckled conductive fiber in FIG. 12 has three μLED elements and is capable of withstanding strains up to 20% without degradation in optoelectronic performance. A buckled conductive fiber with multiple μLED elements may be knit-woven into a cotton sleeve. The fibers maintain their electrical connectivity under fabric deformation. The μLEDs may be reverse-biased as photodetectors to receive high-speed data through light signals.

Fabrics With Conductive Fibers

Buckled and/or helical conductive fibers may be incorporated into fabrics. The fabric may be fabricated with buckled and/or helical conductive fibers alone or may be fabricated with one or more other filaments, yarns, threads, or other fibers. The fabric may be fabricated using any process that uses fibers to create fabrics. For example, the conductive fiber may be woven and/or knitted into a fabric. The buckled and/or helical conductive fibers incorporated into fabrics may include any of the devices described above.

The buckled and/or helical conductive fibers incorporated into the fabric are flexible and stretchable, even if the devices in the fibers are inflexible. The buckled and helical conductive fibers can be stretched and deformed without substantially decreasing the fiber's conductivity. The flexibility and elasticity of the buckled and helical conductive fibers make them well-suited for knitting and weaving into fabrics, grids, cloths, and textiles. The conductive fibers are compatible with conventional fabric manufacturing methods. The flexibility and elasticity of the conductive fibers also make them well-suited for incorporation into garments or other wearable fabrics that can accommodate the wearer's daily movements and activities.

As an example, the buckled and/or helical conductive fibers may be woven (e.g., with a manual loom) with an elastic yarn to create plain weave elastic fabrics. The elastic weave shrinks when it is released from the tension of the loom, and the conductive fibers shrink along with the elastic yarn rather than buckling as a non-elastic fiber would.

Figure 13:
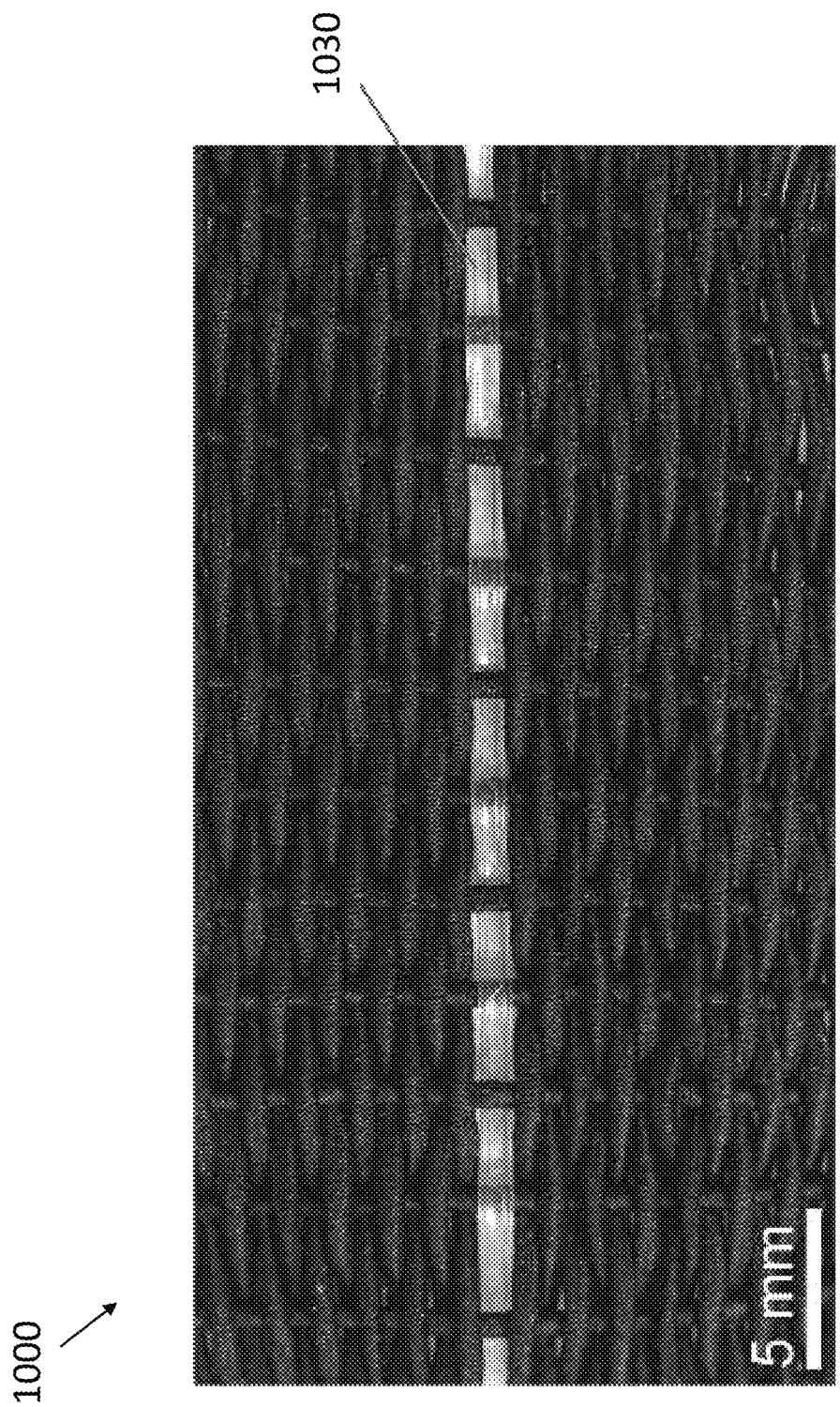
FIG. 13 shows a woven fabric with a buckled conductive fiber.

FIG. 13 shows a buckled conductive fiber woven with an elastic yarn using a manual loom to create an elastic woven fabric having a plain weave. The elastic yarn is a latex/polyester blend yarn. The buckled conductive fiber includes a COCe cladding, a copper wire conductor, and an $\eta_{conductor}$ of about 15%. The buckled conductive fiber in this example has a rectangular cross-section, but elastic conductive fibers with any suitable cross-sectional shape, including those described above, may be woven into a fabric.

Figure 14:
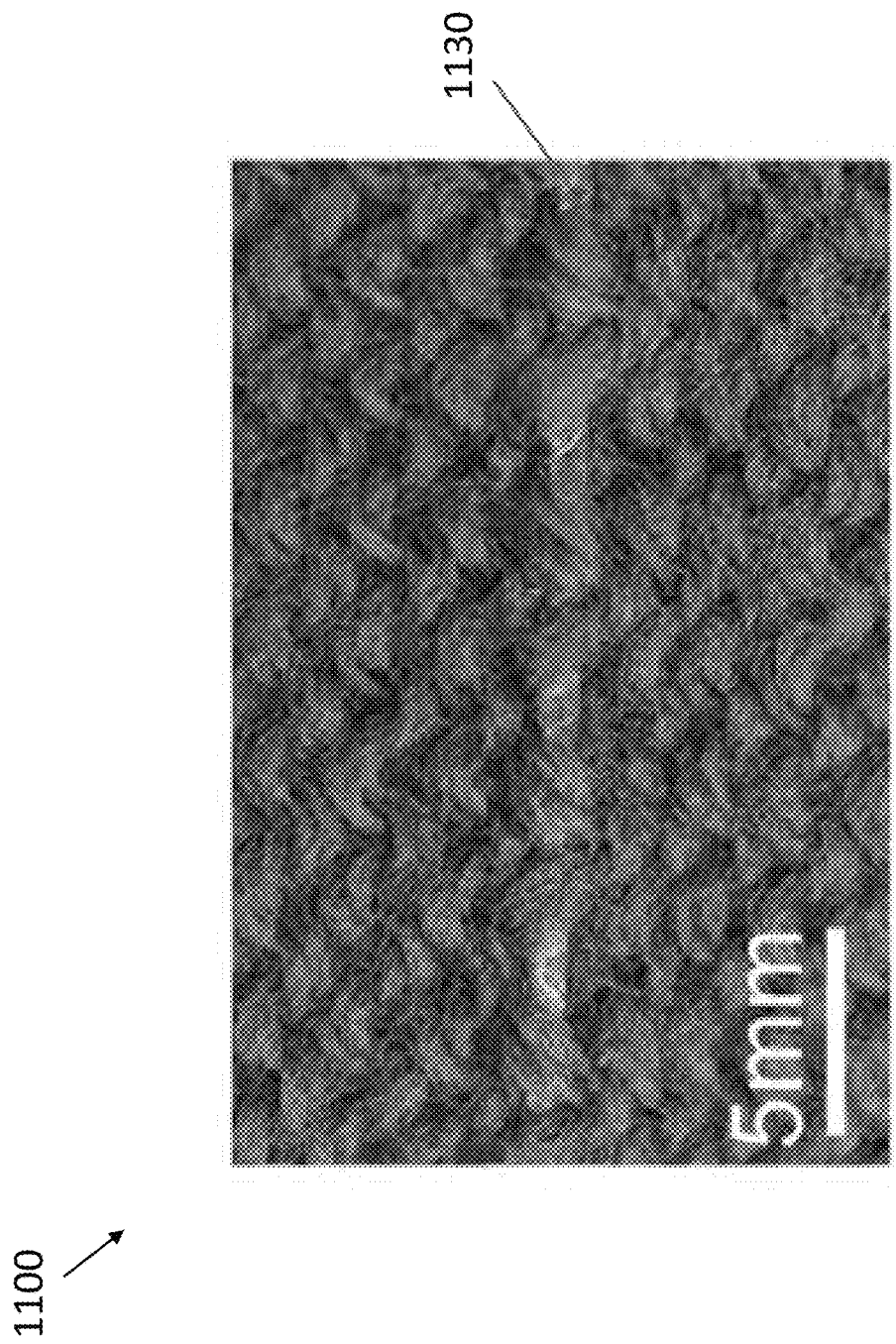
FIG. 14 shows a knitted fabric with a buckled conductive fiber.

FIG. 14 shows a buckled conductive fiber knitted with a wool yarn into a knitted fabric using a knit-weaving technique. The knitted fabric was created using a single-bed knitting machine. The buckled conductive fiber has a COCe cladding, a copper wire conductor, and an $\eta_{conductor}$ of about 25%. The knitted fabric can withstand a fabric strain of about 25% without substantially changing the electrical conductivity of the conductive fiber. The buckled conductive fiber in this example has a circular cross-section to better fit in the knitting machine.

Example Conductive Fibers

Figure 15:
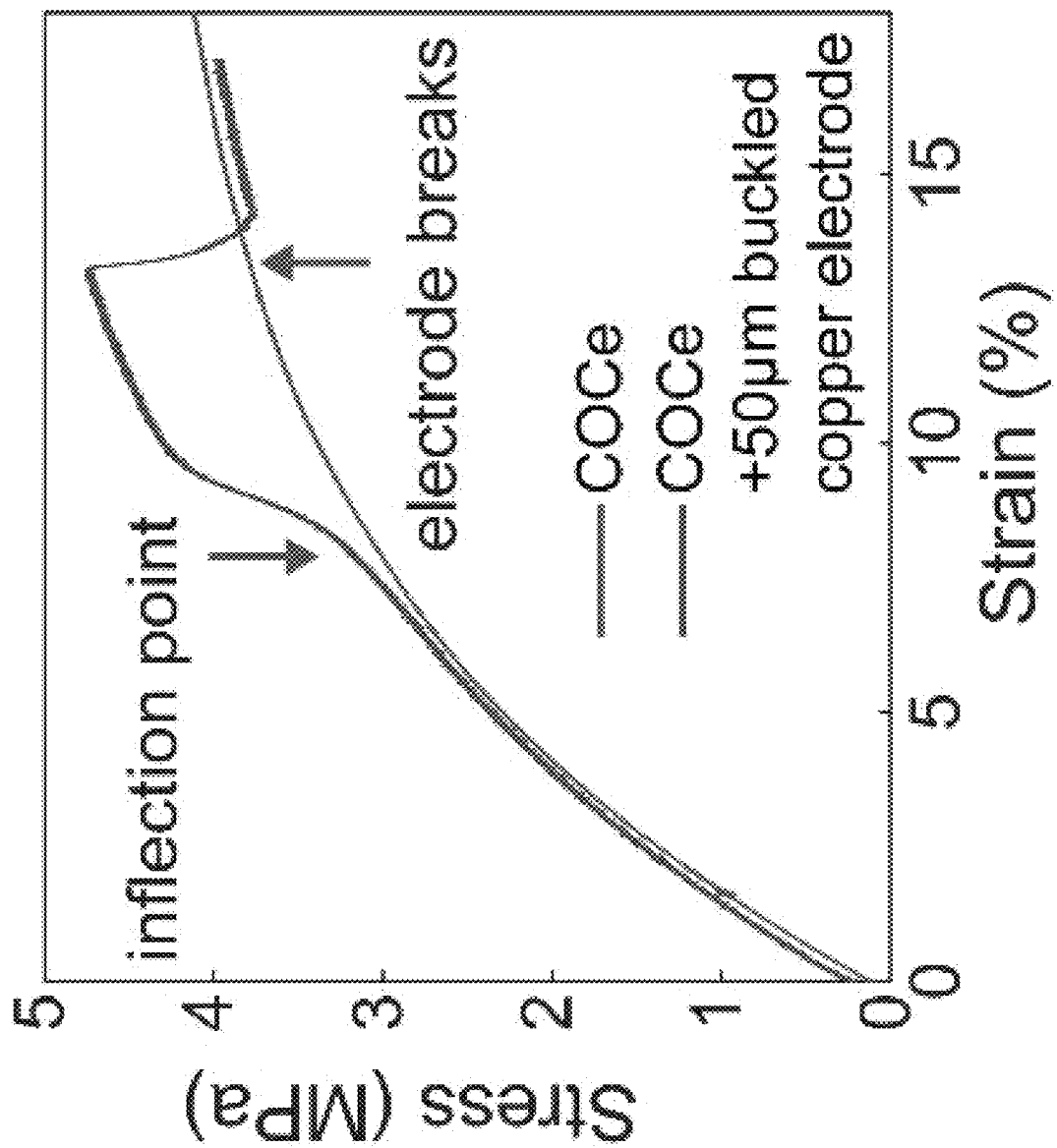
FIG. 15 is a stress-strain curve of elastic conductive fiber made of cyclic olefin copolymer elastomer (COCe) with (upper trace) and without (lower trace) an encapsulated buckled copper wire conductor.

FIG. 15 shows stress-strain curves of COCe fiber with (upper trace) and without (lower trace) an encapsulated buckled copper wire conductor and $\eta_{conductor}$ of about 7.9%. This excess copper wire length was responsible for the J-shaped stress-strain behavior in the upper trace of FIG. 15. When the elongation was less than $\eta_{conductor}$, the COCe fiber with the buckled copper wire conductor exhibited the same tensile properties as the cladding alone, a pure elastomeric fiber. For elongations exceeding $\eta_{conductor}$, the tensile properties of the copper conductor dominated until the copper conductor broke.

The buckled conductive fiber in FIG. 15 was created according to the method shown in FIG. 3. The rectangular preform was formed by hot pressing polymer pellets into a sheet of a desired thickness. The sheet was assembled into the fiber preform having a rectangular cross section and a hollow rectangular channel with a 5-to-1 aspect ratio. The fiber was drawn while feeding a free-standing copper wire with a diameter of 50 µm into the preform s thin rectangular channel, in a process termed convergence. Following the draw, the cladding was stretched and relaxed at a speed of about 15 mm min$^{-1}$ using a uniaxial tester, with a 10-second hold between stretching and relaxing to create the buckled conductor encapsulated in the cladding.

Figure 16:
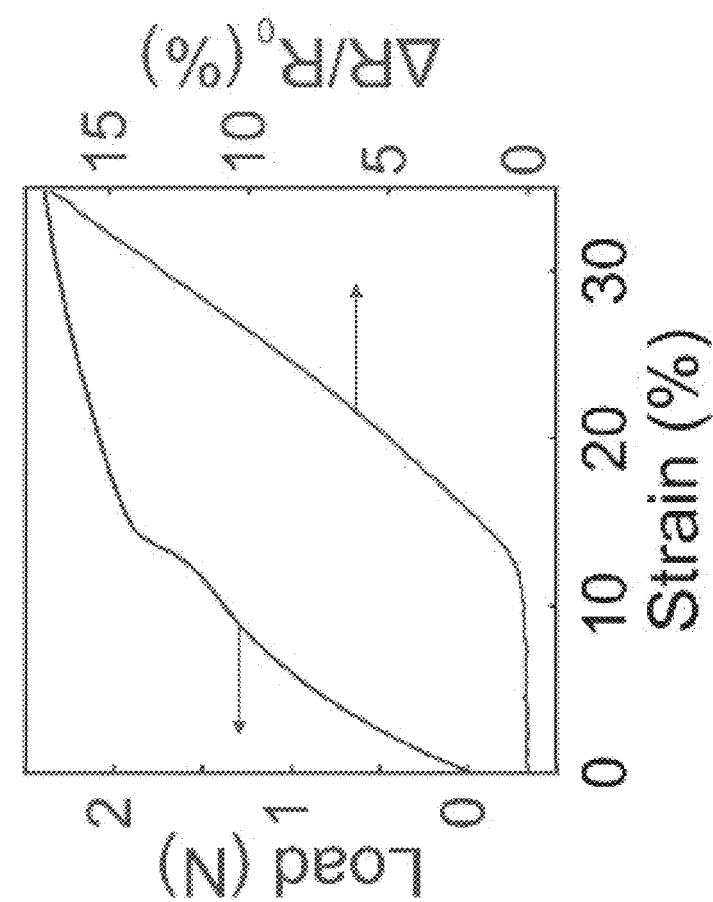
FIG. 16 is a plot of the amount of force (left axis; upper trace) and change in electrical resistance (right axis; lower trace) during tensile deformation of a buckled conductive fiber.

FIG. 16 is a plot of the amount of force experienced by a buckled conductive fiber (left axis) and the change in resistance of the buckled conductive fiber (right axis) during tensile deformation of the buckled conductive fiber. The buckled conductive fiber in FIG. 16 was a COCe fiber with a 50 µm copper electrode having $\eta_{conductor}$ of about 12.9%. The fiber had an average resistivity of $1.87 \times 10^{-8} \pm 0.39 \times 10^{-8}$ Ω m at rest. Under tensile stress, the COCe fiber's resistance increased upon the change in deformation mode at strains larger than $\eta_{conductor}$. Prior to this transition, the resistance of the conductive fiber varied by less than 0.5%. The resistance increased sharply when the strain reaches $\eta_{conductor}$, and the copper conductor switched from bending to tensile deformation.

Figure 17:
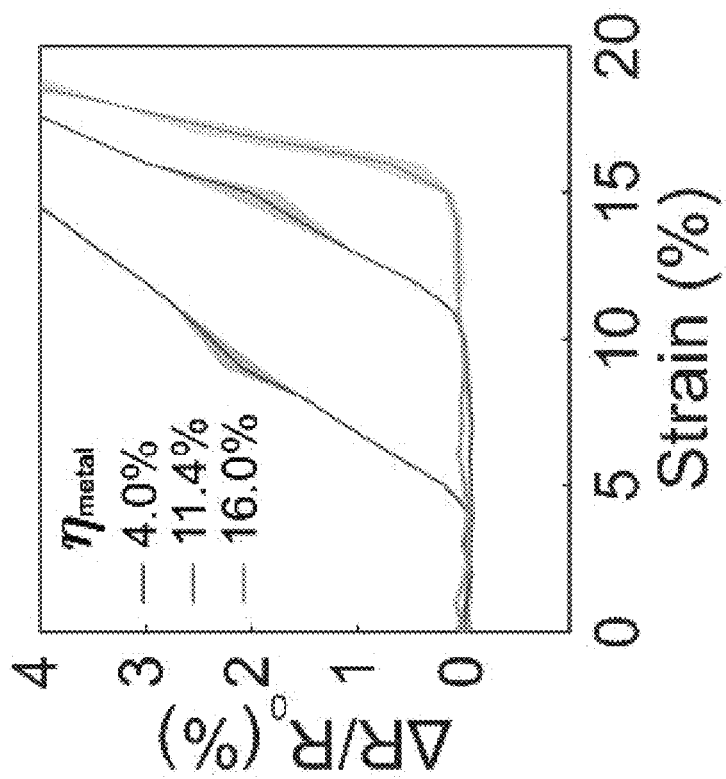
FIG. 17 is a plot of the change in resistance during tensile deformation of a buckled conductive fiber.

FIG. 17 is a plot of the change in resistance during tensile deformation of three buckled conductive fibers with different excess length $\eta_{conductor}$ values. The three 11 conductor values are 4.0%, 11.4%, and 16.0%, with higher values translating to the onset of changes in resistance at higher strain percentages. Put differently, the longer the excess length, the more the elastic conductive fiber can stretch before its resistance changes. Strain cycles of increasing amplitude were applied to the fibers and the resistance was measured between strain cycles. No hysteresis was observed for the buckled conductive fibers until the strain reached 11 conductor Below the elasticity limit, the fibers were able to withstand thousands of stretching cycles.

Figure 18:
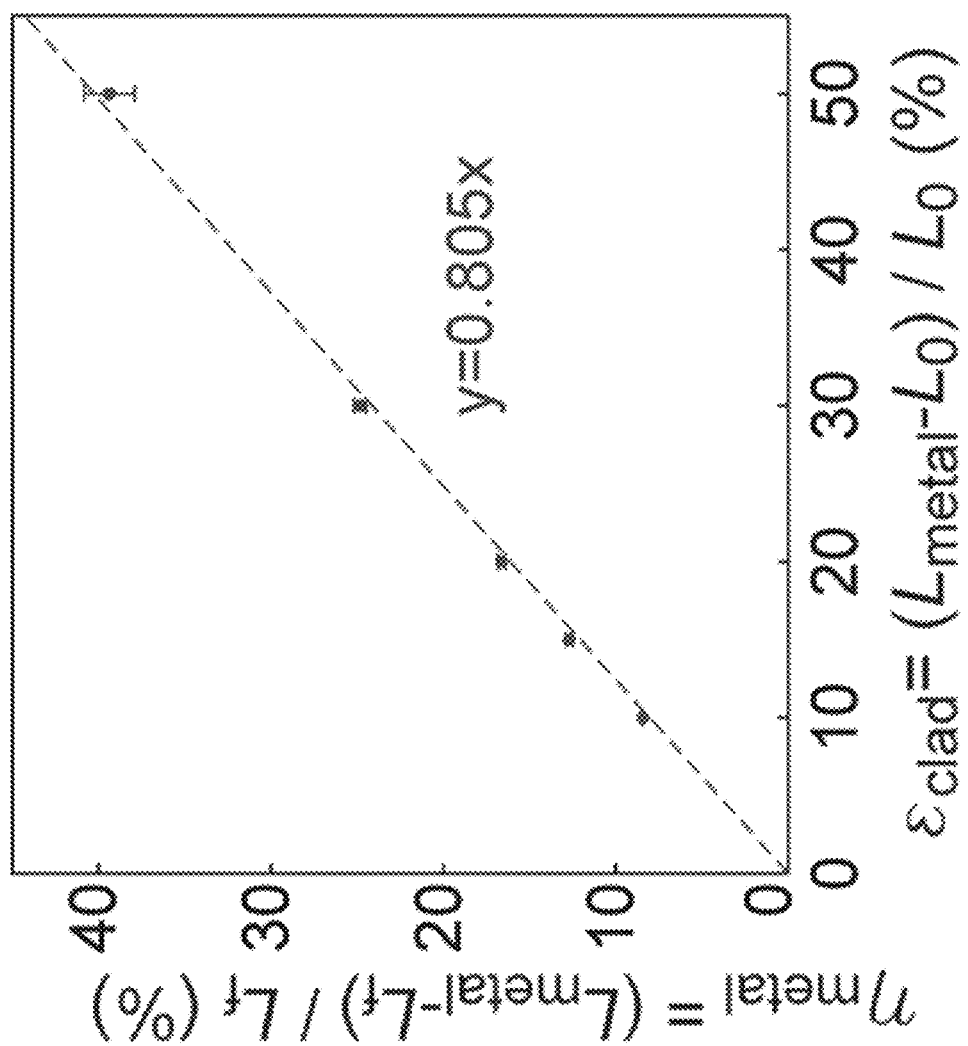
FIG. 18 is a plot of the elasticity of buckled conductive fiber for metal conductors with different excess lengths.

FIG. 18 is a plot of the elasticity of a buckled conductive fiber for different excess amounts of conductive material (here, metal). The buckled conductive fiber in FIG. 18 includes a COCe cladding and a tungsten wire conductor having a diameter of about 25 µm. The $\eta_{conductor}$ of the conductive fiber defines the extent of elasticity in the conductive fiber because $\eta_{conductor}$ determines the how much elongation stress may be applied to the conductive fiber before the metal undergoes tensile deformation. In other words, $\eta_{conductor}$ controls the point where the stress-strain curve diverges from the tensile behavior of the cladding material, the buckled conductor becomes straight, and the metal switches from bending to tensile deformation. The equilibrium between the recovery force in the elastomer and the buckling forces determines $L_{fi}$ and thus $\eta_{conductor}$. For a given elastomer, the recovery force increases with the cross-sectional area and the pre-strain $\varepsilon_{clad}$ of the cladding. FIG. 18 indicates that, for a given fiber geometry, $\eta_{conductor}$ depends linearly on clad up to 50% strain.

Figure 19:
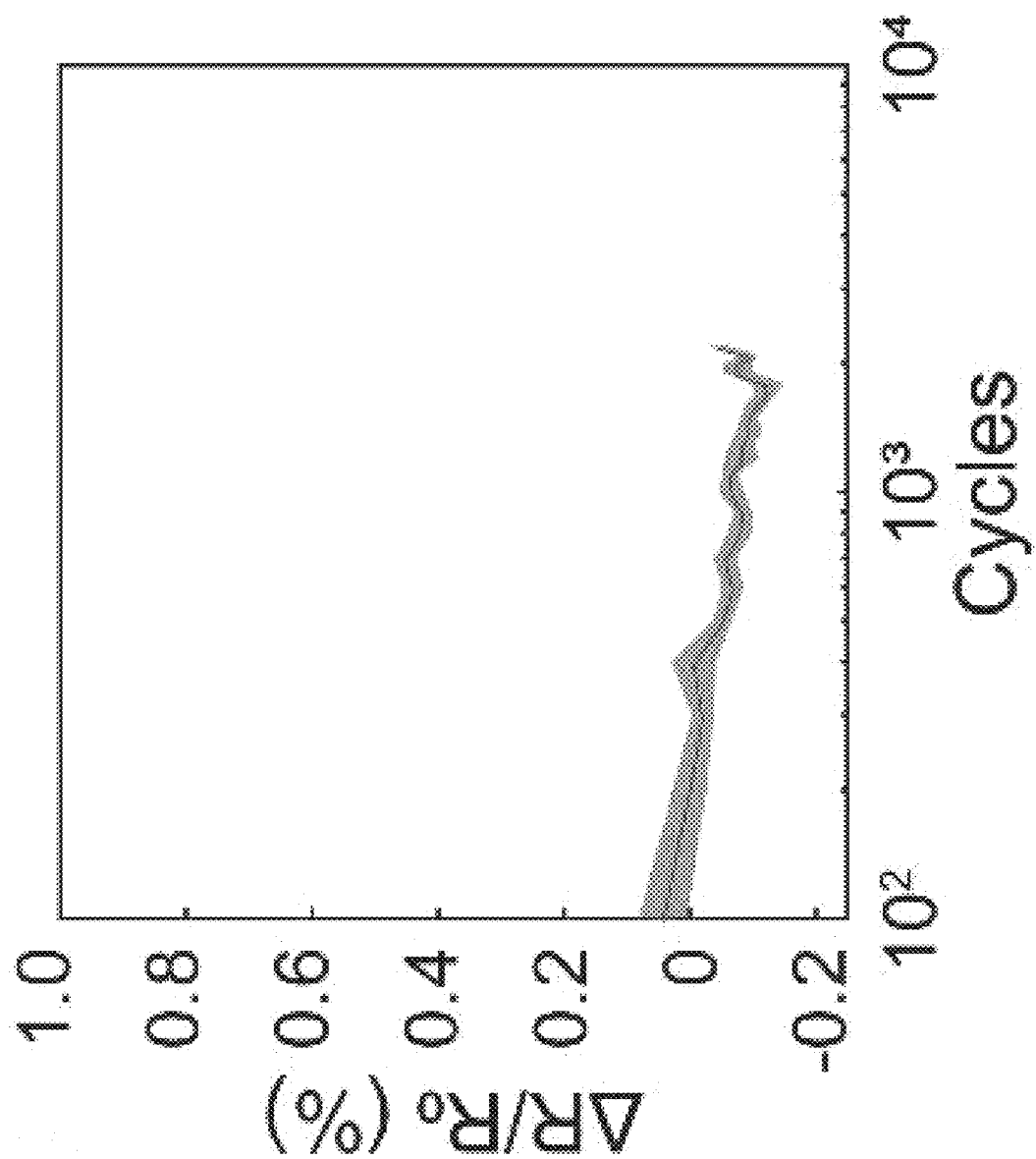
FIG. 19 is a plot of the change in resistance of a buckled conductive fiber over 2300 tensile deformation cycles.

FIG. 19 is a plot of the change in resistance of a buckled conductive fiber over 2300 tensile deformation cycles. The buckled conductive fiber in FIG. 19 included a COCe cladding and a 50 µm copper wire conductor having an $\eta_{conductor}$ of about 25%. The tensile deformation cycles imposed a strain of about 15% over more than 2000 cycles. The conductor in the buckled conductive fiber broke after 2300 cycles. High $\eta_{conductor}$ may lead to higher metal curvature and lower conductor lifetimes. For a conductive fiber used in a wearable garment, most of the strain is experienced when donning and doffing the garment, and 2000 cycles corresponds to a lifetime of about 5.5 years for a garment worn every other day.

Figure 20:
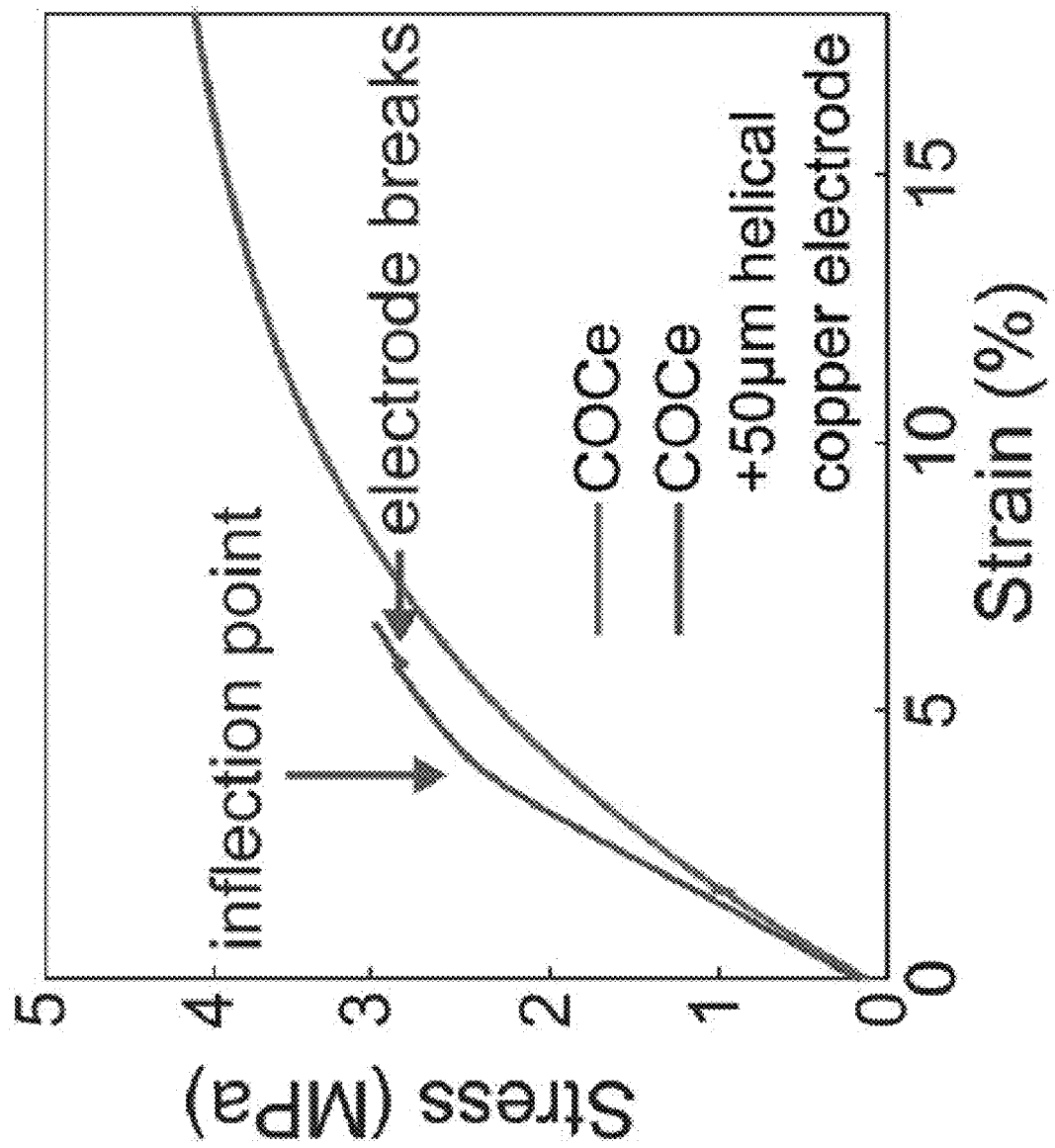
FIG. 20 shows stress-strain curves of a COCe helical conductive fiber (upper trace) and a COCe fiber without a helical copper wire conductor (lower trace).

FIG. 20 shows a stress-strain curve of a COCe helical conductive fiber having $\eta_{conductor}$ conductor of about 5% and a COCe fiber without a helical copper wire conductor embedded therein. The helical conductive fiber (upper trace) exhibited two regimes of stress-strain behavior. At small strains, the stress increased linearly, and was higher than that of the elastomeric cladding without the copper wire. Following a yield-like stress rollover, the stress increased with a lower slope until the wire conductor broke. The strain at the inflection point was noticeably different from $\eta_{conductor}$.

The helical conductive fiber in FIG. 20 had a circular cross-sectional shape. Prior to drawing the helical conductive fiber, the preform was formed by hot pressing polymer pellets into two half cylinder molds. A poly(tetrafluoroethylene) (PTFE) core was placed in the channel and the preform was consolidated in the hot press. The PTFE core was subsequently removed and the preform was drawn into the conductive fiber according to the method disclosed above.

Figure 21:
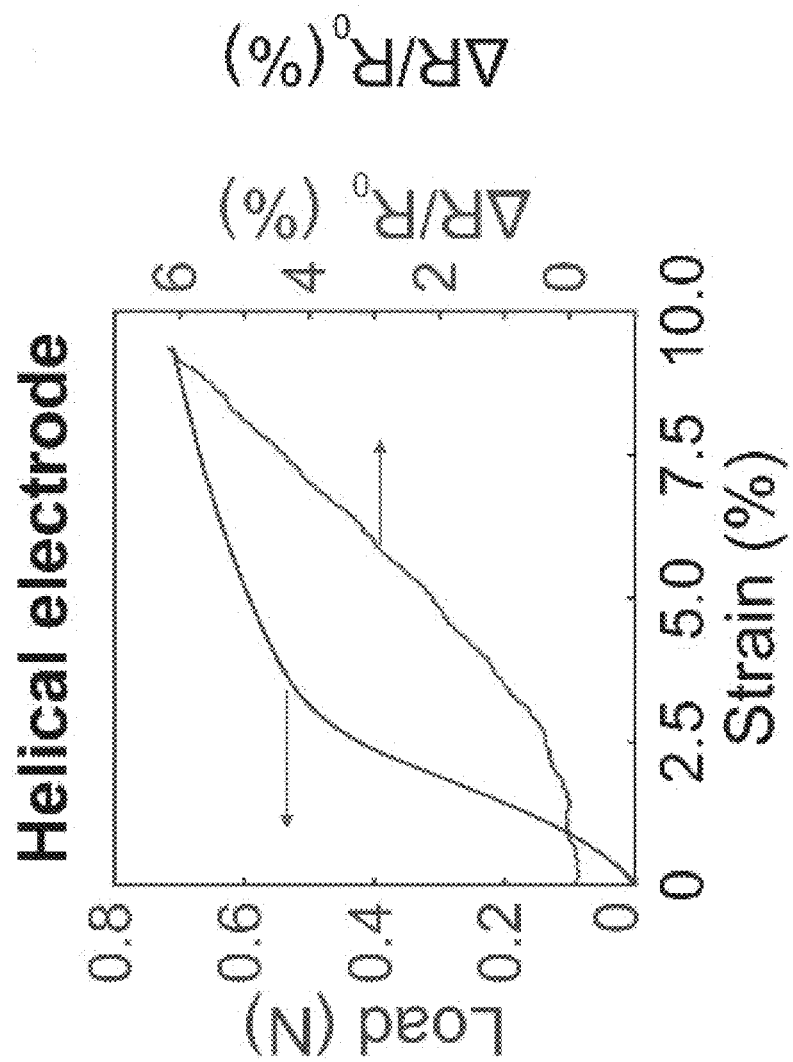
FIG. 21 is a plot of force (left axis; upper trace) and change in electrical resistance (right axis; lower trace) during tensile deformation of a helical conductive fiber.

FIG. 21 is a plot of the amount of force and change in resistance during tensile deformation of a helical conductive fiber. The helical conductive fiber in FIG. 21 was a SEBS fiber with a 50 µm helical copper wire conductor having $\alpha_0$ of 80°. The fiber had an average resistivity of $1.87 \times 10^{-8} \pm 0.39 \times 10^{-8}$ Ω m at rest. Under tensile stress, the increase in resistance coincided with the yield strain of the fiber, as the conductor deformed plastically.

Figure 22:
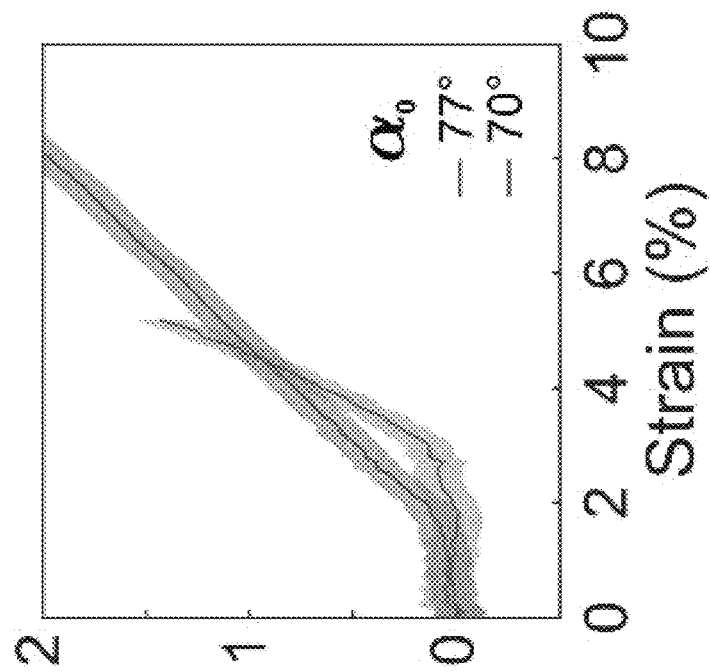
FIG. 22 is a plot of the change in resistance during tensile deformation of a helical conductive fiber at different initial angles between the helical conductor and the cross section of the fiber.

FIG. 22 is a plot of the change in resistance during tensile deformation of two different helical conductive fibers having different $\alpha_0$ values. The two $\alpha_0$ values are 77° (upper trace) and 70° (lower trace). Strain cycles of increasing amplitude were applied to the fibers and the resistance was measured between strain cycles. No hysteresis was observed for the helical conductive fibers until the strain reached the yield strain, defining an elasticity limit. Below the elasticity limit, the fibers were able to withstand thousands of stretching cycles.

Figure 23:
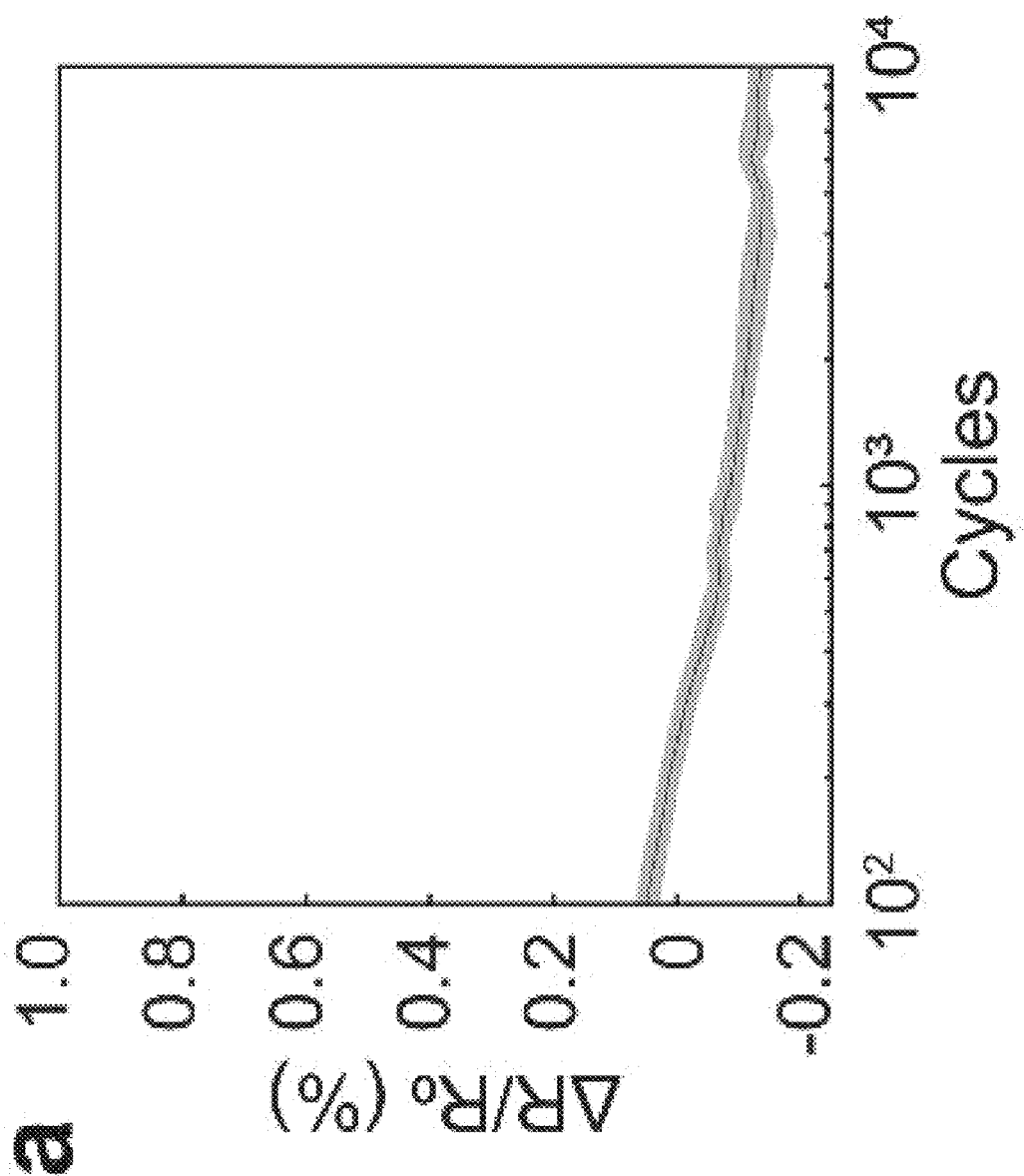
FIG. 23 is a plot of the change in resistance of a helical conductive fiber over 10,000 tensile deformation cycles.

FIG. 23 is a plot of the change in resistance of a helical conductive fiber over 10,000 tensile deformation cycles. The conductive fiber in FIG. 23 included a SEBS cladding and a 50 copper wire conductor with a 25% hollow channel and a $\alpha_0$ of 49.5°. Each cycle of tensile deformation imposed a tensile strain of 10% to the helical conductive fiber. The helical conductive fiber maintained its integrity over 10,000 tensile deformation cycles with less than 0.2% change in resistance.

Figure 24:
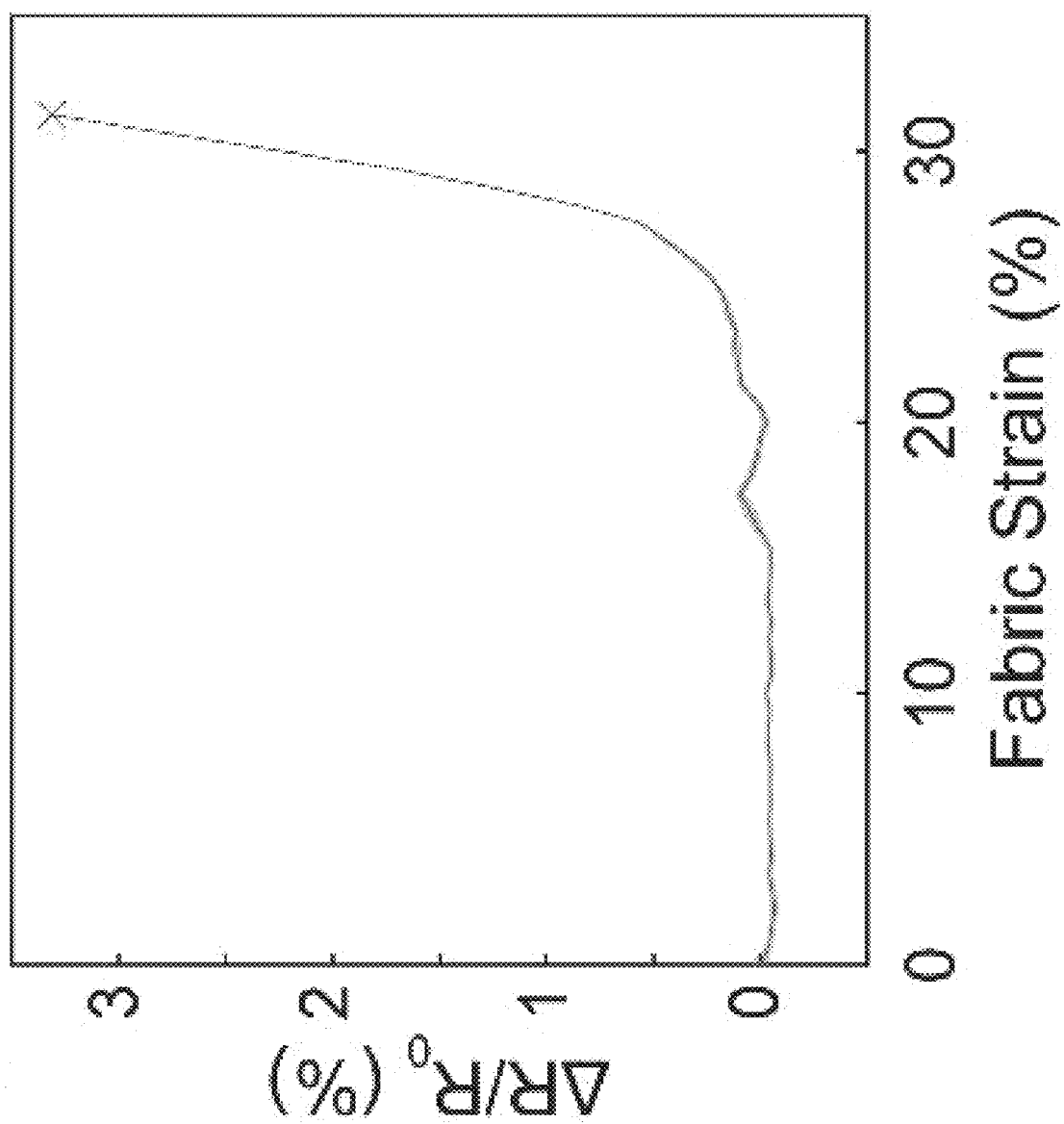
FIG. 24 is a plot of change in resistance during tensile deformation of a buckled conductive fiber knit-woven with wool yarn into a knit fabric.

FIG. 24 is a plot of change in resistance during tensile deformation of a buckled conductive fiber knit-woven with wool yarn into the knit fabric shown in FIG. 14. The conductive fiber in FIG. 24 had a COCe cladding with a 50 µm copper wire conductor and $\eta_{conductor}$ of about 25.1%. The point in the graph marked with an "x" represents loss of electrical contact. The fiber was able to withstand strains up to about 20% without degradation of electrical properties.

Figure 25:
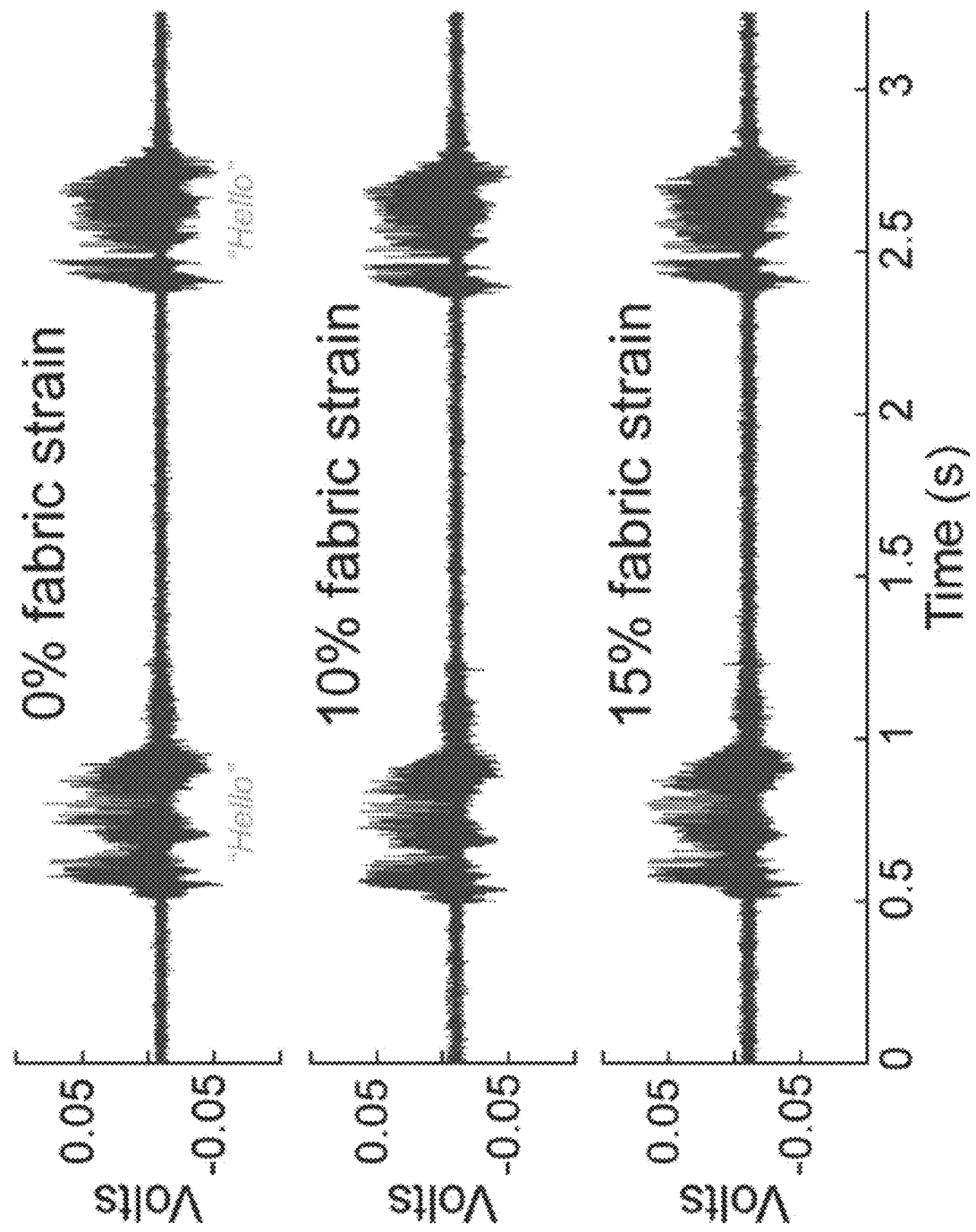
FIG. 25 is a plot of signals generated by a reverse-biased μLED acting as a photodetector in a buckled conductive fiber woven into an elastic plain weave at different fabric strains.

FIG. 25 is a plot of signals received by a reverse-biased µLED in a buckled conductive fiber woven into an elastic plain weave with amplitude modulated by an audio signal at different fabric strains. In this example, the µLED acts as a photodetector that can detect variations in light intensity as deviations in a photocurrent, which is then converted into a voltage that is transmitted to a speaker and an oscilloscope. This is an example of LiFi data transmission using a soft and stretchable fabric. The source signal is a light source with amplitude modulated by an audio signal (recording of a voice saying "Hello" twice). Stretching the fabric by up to 15% does not modify the signal received by the fabric antenna.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A fiber comprising:
   a cladding including a channel formed therein; and
   a conductor disposed in the channel, the conductor having a buckled shape and a length longer than a length of the cladding by about 4% to about 100%,
   wherein the channel has a cross-sectional diameter about 5 to about 500 times larger than a cross-sectional diameter of the conductor.

2. The fiber of claim 1, wherein the conductor has a length that is at least 20% longer than the length of the cladding.

3. The fiber of claim 1, wherein a length of the fiber is at least about 1000 times longer than a width of the fiber.

4. The fiber of claim 1, wherein the conductor comprises a first wire and further comprising a second wire.

5. The fiber of claim 1, wherein the channel is a first channel, the conductor is a first conductor, the cladding includes a second channel formed therein, and further comprising a second conductor disposed in the second channel.

6. The fiber of claim 1, further comprising at least one device electrically coupled to the conductor and disposed in the channel.

7. The fiber of claim 6, wherein the at least one device is electrically coupled to the conductor in series.

8. The fiber of claim 6, wherein the conductor is a first conductor, and further comprising:
   a second conductor embedded in the cladding,
   wherein the at least one device is electrically coupled in parallel to the first conductor and the second conductor.

9. The fiber of claim 6, wherein the at least one device comprises at least one of a diode, a photodiode, a light emitting diode, a laser diode, a photodetector, or a transistor.

10. The fiber of claim 6, wherein the at least one device comprises at least one of a memory chip, a processor, a microcontroller, or a thermistor.

11. The fiber of claim 1, wherein the cladding comprises a thermoplastic elastomer material.

12. The fiber of claim 11, wherein the thermoplastic elastomer material comprises at least one of poly (styrene-b-(ethylene-co-butylene)-b-styrene), thermoplastic polyurethane, or cyclic olefin copolymer elastomer.

13. The fiber of claim 1, wherein the conductor comprises a conductive metal.

14. The fiber of claim 13, wherein the conductive metal comprises at least one of copper, tungsten, iron, aluminum, titanium, chromium, nickel, gold, or silver.

15. The fiber of claim 1 wherein the conductor has a conductivity of at least $10^7$ S m$^{-1}$.

16. The fiber of claim 1, wherein:
   the cladding comprises cyclic olefin copolymer elastomer,
   the conductor comprises copper,
   the length of the conductor is about 20% to about 30% longer than the length of the cladding, and
   the fiber has a diameter of about 1 mm to about 4 mm.

17. A fabric comprising the fiber of claim 1 woven or knitted into the fabric.

18. A method comprising:
   forming a fiber comprising a cladding and a portion of a conductor disposed in a channel formed in the cladding;
   stretching the cladding along a longitudinal axis of the fiber to pull a second portion of the conductor into the channel; and
   after stretching the cladding, relaxing the cladding to induce buckling of the conductor in the channel,
   wherein the channel has a cross-sectional diameter about 5 to about 500 times larger than a cross-sectional diameter of the conductor.

19. The method of claim 18, wherein buckling of the conductor causes the conductor to have a length that is at least 20% longer than a length of the fiber.

20. A fiber comprising:
   a cladding including a channel formed therein;
   a conductor disposed in the channel, the conductor having a buckled shape and a length longer than a length of the cladding by about 4% to about 100%; and
   at least one device electrically coupled to the conductor and disposed in the channel,
   wherein the at least one device is electrically coupled to the conductor in series.

21. A fiber comprising:
   a cladding including a channel formed therein; and
   a solid metal conductor disposed in the channel, the solid metal conductor having a buckled shape and a length longer than a length of the cladding by about 4% to about 100%.

* * * * *